US010763209B2

(12) United States Patent
Olac-Vaw et al.

(10) Patent No.: US 10,763,209 B2
(45) Date of Patent: Sep. 1, 2020

(54) MOS ANTIFUSE WITH VOID-ACCELERATED BREAKDOWN

(71) Applicant: INTEL CORPORATION, Santa Clara, CA (US)

(72) Inventors: Roman Olac-Vaw, Hillsboro, OR (US); Walid Hafez, Portland, OR (US); Chia-Hong Jan, Portland, OR (US); Hsu-Yu Chang, Hillsboro, OR (US); Ting Chang, Portland, OR (US); Rahul Ramaswamy, Hillsboro, OR (US); Pei-Chi Liu, Portland, OR (US); Neville Dias, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 197 days.

(21) Appl. No.: 15/327,338

(22) PCT Filed: Aug. 19, 2014

(86) PCT No.: PCT/US2014/051618
§ 371 (c)(1),
(2) Date: Jan. 18, 2017

(87) PCT Pub. No.: WO2016/028266
PCT Pub. Date: Feb. 25, 2016

(65) Prior Publication Data
US 2017/0162503 A1 Jun. 8, 2017

(51) Int. Cl.
*H01L 29/78* (2006.01)
*H01L 23/525* (2006.01)
(Continued)

(52) U.S. Cl.
CPC .......... *H01L 23/5252* (2013.01); *G11C 17/16* (2013.01); *H01L 21/768* (2013.01);
(Continued)

(58) Field of Classification Search
CPC ............ H01L 23/5252; H01L 23/5256; H01L 21/768; H01L 29/42376; H01L 29/66545;
(Continued)

(56) References Cited

U.S. PATENT DOCUMENTS

| 5,464,790 A | 11/1995 | Hawley |
| 5,807,786 A | 9/1998 | Chang |

(Continued)

FOREIGN PATENT DOCUMENTS

| JP | 2001267561 | 9/2001 |
| JP | 2008218962 | 9/2008 |

(Continued)

OTHER PUBLICATIONS

International Search Report and Written Opinion for International Patent Application No. PCT/US2014/051618, dated May 19, 2015.
(Continued)

*Primary Examiner* — Farun Lu
(74) *Attorney, Agent, or Firm* — Green, Howard & Mughal LLP

(57) ABSTRACT

A MOS antifuse with an accelerated dielectric breakdown induced by a void or seam formed in the electrode. In some embodiments, the programming voltage at which a MOS antifuse undergoes dielectric breakdown is reduced through intentional damage to at least part of the MOS antifuse dielectric. In some embodiments, damage may be introduced during an etchback of an electrode material which has a seam formed during backfilling of the electrode material into an opening having a threshold aspect ratio. In further embodiments, a MOS antifuse bit-cell includes a MOS transistor and a MOS antifuse. The MOS transistor has a gate electrode that maintains a predetermined voltage threshold swing, while the MOS antifuse has a gate electrode with a void accelerated dielectric breakdown.

21 Claims, 14 Drawing Sheets

(51) Int. Cl.
*H01L 29/423* (2006.01)
*H01L 29/66* (2006.01)
*G11C 17/16* (2006.01)
*H01L 21/768* (2006.01)
*H01L 27/112* (2006.01)

(52) U.S. Cl.
CPC .. *H01L 29/42376* (2013.01); *H01L 29/66545* (2013.01); *H01L 29/78* (2013.01); *H01L 27/11206* (2013.01); *H01L 2924/0002* (2013.01)

(58) Field of Classification Search
CPC ... H01L 29/78; H01L 27/101; H01L 27/1021; H01L 21/823468; H01L 82345; H01L 21/823462; H01L 21/823842; H01L 21/823857; H01L 21/823864; H01L 27/0629; H01L 29/785; G11C 17/16; G11C 11/5685; G11C 11/5692; G11C 13/0007; G11C 17/06; G11C 17/146; G11C 17/165; G11C 2213/32; G11C 2213/72
See application file for complete search history.

(56) References Cited

U.S. PATENT DOCUMENTS

| | | | |
|---|---|---|---|
| 7,087,975 | B2 | 8/2006 | Lehmann |
| 7,157,782 | B1 | 1/2007 | Shih et al. |
| 9,123,801 | B2 | 9/2015 | Meiser |
| 9,196,542 | B2* | 11/2015 | Wang .............. H01L 21/823468 |
| 2004/0023440 | A1 | 2/2004 | Ito et al. |
| 2006/0289931 | A1 | 12/2006 | Kim et al. |
| 2008/0042194 | A1* | 2/2008 | Hshieh ............. H01L 21/28035 257/331 |
| 2008/0197911 | A1* | 8/2008 | Lim ....................... G11C 17/18 327/525 |
| 2010/0148274 | A1 | 6/2010 | Tai et al. |
| 2011/0080765 | A1 | 4/2011 | Groepl et al. |
| 2012/0248567 | A1 | 10/2012 | Hsu et al. |
| 2012/0327700 | A1 | 12/2012 | Li |
| 2014/0070320 | A1 | 3/2014 | Mukherjee et al. |
| 2015/0311081 | A1* | 10/2015 | Xie ................... H01L 21/28008 257/411 |

FOREIGN PATENT DOCUMENTS

| | | |
|---|---|---|
| KR | 1020080076618 | 8/2008 |
| KR | 20100100398 | 9/2010 |
| TW | 201007824 | 2/2010 |
| TW | 201334119 | 8/2013 |

OTHER PUBLICATIONS

International Preliminary Report on Patentability for International Patent Application No. PCT/US2014/051618, dated Mar. 2, 2017, 11 pages.
Notice of Allowance for U.S. Appl. No. 15/110,706, dated Feb. 23, 2018.
Decision for Grant from Japanese Patent Application No. 2017-502980 dated Aug. 24, 2018, 2 pgs.
Non-Final Office Action from Japanese Patent Application No. 2017-502980 dated May 8, 2018 3 pgs.
Non-Final Office Action and Search Report from Taiwan Patent Application No. 104122774 dated Nov. 14, 2018, 10 pgs.
Office Action from Chinese Patent Application No. 201480080746.6 dated Jan. 22, 2020, 25 pgs.

* cited by examiner

MOS ANTIFUSE WITH VOID-ACCELERATED BREAKDOWN

CLAIM OF PRIORITY

This Application is a National Stage Entry of, and claims priority to, PCT Application No. PCT/US2014/051618, filed on 19 Aug. 2014 and titled "MOS ANTIFUSE WITH VOID-ACCELERATED BREAKDOWN", which is incorporated by reference in its entirety for all purposes.

TECHNICAL FIELD

Embodiments described herein generally relate to integrated circuits (ICs) and monolithic semiconductor devices, and more particularly pertain to a monolithic antifuse.

BACKGROUND

Monolithic ICs generally comprise a number of transistors, such as metal-oxide-semiconductor field-effect transistors (MOSFETs) fabricated over a planar substrate, such as a silicon wafer.

ICs often include at least one antifuse. An antifuse is an electrical device that starts with a high resistance and is designed to permanently create a conductive path when the voltage across the device exceeds a threshold level. With transistor dimension scaling from one generation to another, it is advantageous to scale down the antifuse program voltage.

MOS antifuse designs often employ a MOS transistor-based structure, as depicted in FIG. 1A. MOS antifuse 10 disposed on substrate 5 employs a gate electrode 13 and a source/drain contacts 14 surrounded by an isolation dielectric 15. With gate electrode 13 biased up to a programming voltage and source/drain contacts 14 held at a reference potential (e.g. ground), the antifuse program circuit path passes through a gate dielectric 11, a nominally doped semiconductor well or fin 8, and heavily doped semiconductor source/drain 9. Formation of a conductive path during a programming operation entails permanently breaking down gate dielectric 11, which changes the resistance between gate electrode 13 and source/drain contacts 14. If gate dielectric 11 is intact, antifuse 10 displays normal MOSFET characteristics. If gate dielectric 11 experiences dielectric breakdown, antifuse 10 will not have normal MOSFET characteristics and instead have an associated programmed antifuse resistance.

MOS antifuse architectures and associated fabrication techniques that offer lower antifuse program voltages are advantageous.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1A:
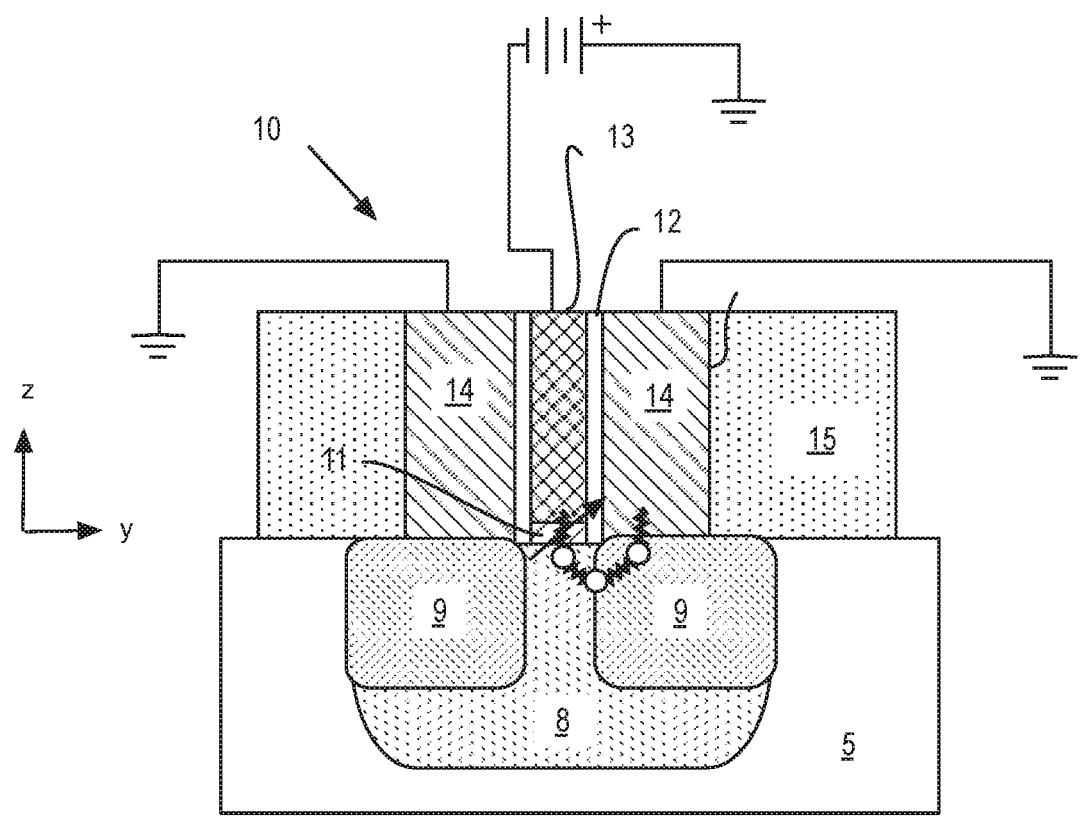
FIG. 1A is a cross-sectional view of conventional monolithic MOS antifuse.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example up, down, top, bottom, and so on, may be used merely to facilitate the description of features in the drawings. Terms such as "upper" and "lower" "above" and "below" may be understood by reference to illustrated X-Z coordinates, and terms such as "adjacent" may be understood by reference to X,Y coordinates or to non-Z coordinates. Relative positional terms are employed herein merely as labels distinguishing one structural feature from another in a manner that may be more clear than enumerative labels, such as "first," "second," "third," etc.

In the following description, numerous details are set forth, however, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical, optical, or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material layer disposed over or under another may be directly in contact or may have one or more intervening material layers. Moreover, one material disposed between two materials or material layers may be directly in contact with the two layers or may have one or more intervening layers. In contrast, a first material or material layer "on" a second material or material layer is in direct contact with that second material/material layer. Similar distinctions are to be made in the context of component assemblies.

As used in throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Monolithic MOS antifuse and MOS antifuse bit-cells, as well as exemplary techniques to fabricate such structures are described herein. A void or seam formed during deposition of a gate electrode employed as a terminal of a MOS antifuse is exploited to accelerate dielectric breakdown in the MOS antifuse. In some embodiments, the programming voltage at which a MOS antifuse undergoes dielectric breakdown is reduced through intentional damage to at least part of the MOS antifuse gate dielectric. In some embodiments, antifuse gate dielectric damage may be introduced as an etch back of a gate electrode material exposes a seam formed during a gate electrode backfilling process. During the etch back, the seam may be opened to expose the underlying gate dielectric layer to the etch back process, or another process thereafter, which may damage the gate dielectric in a manner that lowers the film's resistance to one or more electrical breakdown mechanism. In further embodiments, a MOS antifuse bit-cell includes a MOS transistor and a MOS antifuse. The MOS transistor has a gate electrode without an exposed seam and maintains a predetermined voltage threshold swing. The MOS antifuse has a gate electrode with an exposed seam and displays the accelerated dielectric breakdown.

With an accelerated breakdown, the dielectric breakdown voltage for a MOS capacitor is lower than a reference breakdown voltage for the particular MOS stack. In advantageous embodiments, dielectric breakdown may be accelerated to below a reference breakdown threshold (e.g., <4.0V Gate-to-Drain breakdown voltage) typical for the reference MOS stack. The reference MOS stack may be further employed in a MOSFET that is integrated with the MOS antifuse having void-accelerated breakdown, for example in a MOS antifuse bit-cell.

Figure 1B:
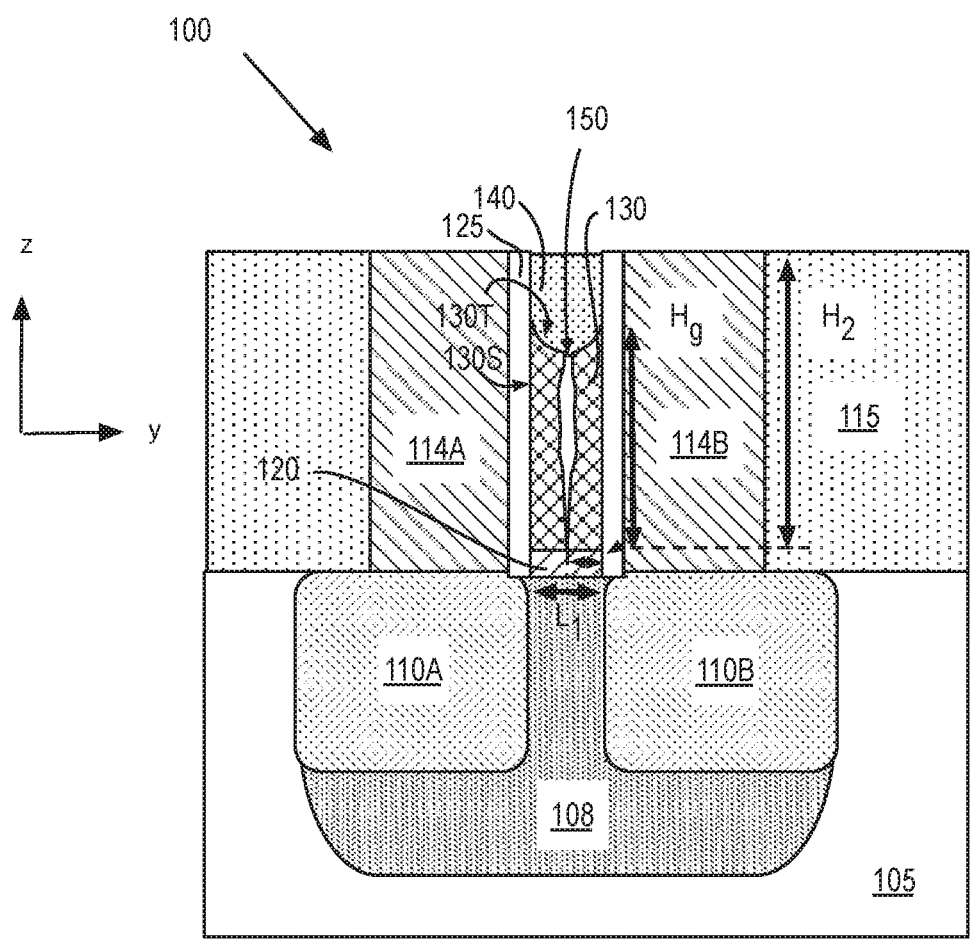
FIG. 1B is a cross-sectional view of a monolithic MOS antifuse with void-accelerated breakdown, in accordance with an embodiment.

FIG. 1B is a cross-sectional view of a monolithic MOS antifuse with void-accelerated breakdown, in accordance with an embodiment. The cross-sectional view is applicable to both planar and non-planar (e.g., fin) MOS antifuse structures. Structural differences between planar and non-planar embodiments would be more apparent along an axis out of the plane illustrated in FIG. 1B, but are not illustrated as embodiments herein are independent of such features and therefore equally applicable to planar and non-planar technologies.

MOS antifuse 100 includes a semiconductor channel region 108 disposed over substrate 105. Substrate 105 may be any substrate suitable for forming an IC, such as, but not limited to, a semiconductor substrate, semiconductor-on-insulator (SOI) substrate, or an insulator substrate (e.g., sapphire), the like, and/or combinations thereof. In one exemplary embodiment, substrate 105 includes a substantially monocrystalline semiconductor, such as, but not limited to, silicon. Exemplary semiconductor compositions also include group IV systems, such as silicon, germanium, or an alloy thereof group III-V systems, such as GaAs, InP, InGaAs, and the like; or group III-N systems, such as GaN.

A semiconductor source region 110A, and semiconductor drain region 110B are disposed on opposite sides of channel region 108 and have a conductivity type opposite that of channel region 108. Channel region 108 may be substantially undoped (i.e., not intentionally doped relative to substrate 105). However, in the exemplary embodiment, channel region 108 has a nominal doping level of a certain conductivity type (e.g., p-type) while source, drain regions 110, 111 have a nominal doping level of the complementary conductivity type (e.g., n-type). A source contact 114A interfaces with source region 110A, while a drain contact 114B interfaces with drain region 110B. Any contact metallization known to be compatible (e.g., provides good ohmic behavior) with the composition of semiconductor source, drain regions 110A, 110B may be utilized.

Contact metallization is surrounded by dielectric material 115, 125. Isolation dielectric 115 and intervening spacer dielectric 125 may be any known dielectric materials, such as, but not limited to, silicon oxides (SiO), silicon nitrides (SiN), silicon oxynitrides (SiON), silicon carbonitrides (SiCN), or low-k materials (e.g., carbon doped silicon dioxide (SiOC), porous dielectrics, etc.). Spacer dielectric 125 is of a nominal thickness, for example, 20 nm, or less, in advanced CMOS technology. Isolation dielectric 115 may be any thickness to accommodate planarization with source, drain contacts 114A, 114B.

Disposed over channel region 108 is a gate dielectric 120. While gate dielectric 120 may be any dielectric material and have any thickness known to provide suitable function within a MOS stack, both composition and physical thickness of gate dielectric 120 impact nominal dielectric breakdown voltage (e.g., gate-to-drain) of a MOS capacitor, and also may affect acceleration of the dielectric breakdown in accordance with embodiments herein. Materials such as silicon dioxide ($SiO_2$), silicon nitride ($Si_3N_4$), silicon oxynitride (SON), having bulk dielectric constants in the range of 3.9 to about 8, may be utilized for gate dielectric 120. In advantageous embodiments however, gate dielectric 120 is a high-k dielectric material have a bulk dielectric constant of at least 10. Exemplary high-k materials include, but are not limited to, metal oxides (e.g., $HfO_2$), and metal silicates. Gate dielectric 120 may also be a laminate stack of more than one dielectric (e.g., two or more thin films of the above materials). Gate dielectric 120 may have a range of physical thicknesses, which may be a function of dielectric composition as limited by typical MOS stack parameters, such as leakage current, etc. In exemplary embodiments, gate dielectric 120 is of a nominal thickness dependent upon its bulk relative permittivity to achieve a desired equivalent oxide thickness (EOT), for example, 10 nm, or less.

Gate dielectric 120 separates channel region 108 from gate electrode 130. Gate electrode 130 is further separated from source, drain contacts 114A, 114B by spacer dielectric 125. While material composition and dimensions of gate electrode 130 may vary widely, both the composition and dimension may impact acceleration of the antifuse gate dielectric breakdown in accordance with embodiments herein. Gate electrode 130 may include any material providing a desired work function (e.g., an n-type, p-type, or mid-gap material). A work function material may vary to accommodate various work function targets by including an appropriate metal, or by doping a semiconductor gate electrode material, such as, but not limited to, polysilicon. In addition to a work function material interfacing gate dielectric 120, gate electrode 130 may further include a bulk or "fill" material disposed over the work function material. In exemplary embodiments the fill material accounts for a majority of gate electrode z-height $H_g$. The composition and dimension of the fill metal may impact acceleration of the antifuse gate dielectric breakdown in accordance with embodiments herein. As described further below, in advantageous embodiments, at least the fill material of gate electrode 130 is amenable to being deposited by a technique that has sufficient conformality. Exemplary fill materials include metals and semiconductors (e.g., polysilicon). In advantageous embodiments, gate electrode 130 includes tungsten (W) fill. Other exemplary electrode fill metal embodiments include any of copper (Cu), titanium (Ti), aluminum (Al), nickel (Ni), cobalt (Co), and their alloys.

In embodiments, gate electrode 130 has a z-height $H_g$ from an interface with gate dielectric 120, and a gate length $L_1$ across channel region 108 (e.g., in y-axis). The z-height $H_g$ may vary widely, for example between 10 nm and 100 nm, as a function of a variety of factors. As further illustrated in FIG. 1B, z-height $H_g$ is less than a corresponding z-height of spacer dielectric 125, and/or source, drain 114A, 114B (e.g., z-height $H_2$ measured from a same reference plane as $H_g$). A capping material 140 is disposed over gate electrode 130. Gate capping material 140 may provide electrical isolation over a top surface of gate electrode 130 and, in the exemplary embodiment, substantially planarizes the gate stack with spacer dielectric 125. Gate capping material 140 may have a same composition as one or more of gate dielectric 120, isolation dielectric 115, and spacer dielectric 125, or may have a composition distinct from any and/or all other dielectrics allowing for etch selectively between materials. In exemplary embodiments, gate capping material 140 includes one or more of: SiO, SiON SiN, SiCN, SiC, low-k dielectric (e.g., carbon-doped oxide), or the like. Gate capping material 140 may also be a metal or semiconductor (e.g., polysilicon).

In embodiments, a MOS antifuse gate electrode includes a seam extending from a top surface of the gate electrode, downward through a z-height of the gate electrode. The inventors have found the seam in the electrode to provide a basis for advantageously accelerating antifuse dielectric breakdown. Although not bound by theory, it is currently understood that a gate electrode seam enables processing performed subsequent to opening of the seam to alter one or more property of gate dielectric 120 (e.g., damage gate dielectric 120). In the exemplary embodiment illustrated in FIG. 1B, gate electrode 130 includes a seam 150 that extends from a top surface 130T, through a z-height $H_g$, and approaching gate dielectric 120. In the illustrated embodiment, seam 150 joins to gate dielectric 120. In other embodiments however, the gate electrode seam 150 does not intersect gate dielectric 120, but instead terminates within gate electrode 130. For example, in one embodiment where gate electrode 130 includes a fill metal disposed over a work function metal, seam 150 does not extend through the work function metal. In such embodiments, seam 150 may interface with the work function metal or be separated from the work function metal by some nominal bottom thickness of fill metal.

Seam 150 may be substantially unfilled (i.e., a void), or may be partially or completely backfilled by a material, which may be of a same or distinct composition as gate electrode 130. In the exemplary embodiment depicted, gate electrode seam 150 includes one or more unfilled void. For embodiments where seam 150 is at least partially backfilled, for example by gate capping material 140, seam 150 may be a decorated material interface where microstructure and/or composition is discontinuous within gate electrode 130. Even where gate electrode seam 150 comprises an unfilled void, such a void is occluded by gate capping material 140. In further embodiments, gate electrode seam 150 is disposed at approximately the center of the gate electrode 130. Seam 150 is laterally aligned to approximately ½ the gate length $L_1$ as a result of the deposition process employed to form gate electrode 130. As such, seam 150 is "self-aligned" and does not require an additional masking process to space seam 150 from isolation dielectric 125 by 5-10 nm for a 10-20 nm $L_1$, for example.

In embodiments, an antifuse gate electrode top surface is non-planar. A depression, or divot, is disposed around a seam extending through a z-height of the gate electrode. As illustrated in FIG. 1B, gate electrode 130 includes a top electrode surface 130T that is non-planar. Top electrode surface 130T has a maximum z-height $H_g$ proximal a gate electrode sidewall 130S with a minimum z-height less than $H_g$ proximal gate electrode seam 150. These topographical features of gate electrode 130 are indicative of a gate electrode recess etch that reduced the gate electrode to a maximum z-height $H_g$ from some greater z-height, such as $H_2$. As described further below, because of the presence of seam 150, the gate electrode recess etch progresses more rapidly proximal seam 150, forming a depression below $H_g$ in top electrode surface 130T on either side of seam 150. Such a non-planar top gate electrode surface is therefore indicative of a seam-accelerated gate electrode recess etch. Because inventors have found exposure of a gate electrode seam to gate electrode etchant species advantageously accelerates dielectric breakdown, the non-planar recessed top gate electrode surface 130T is indicative of antifuse 100 having void-accelerated dielectric breakdown (e.g., gate dielectric 120 may be damaged by exposure to the gate recess process as facilitated by seam 150).

Figure 2:
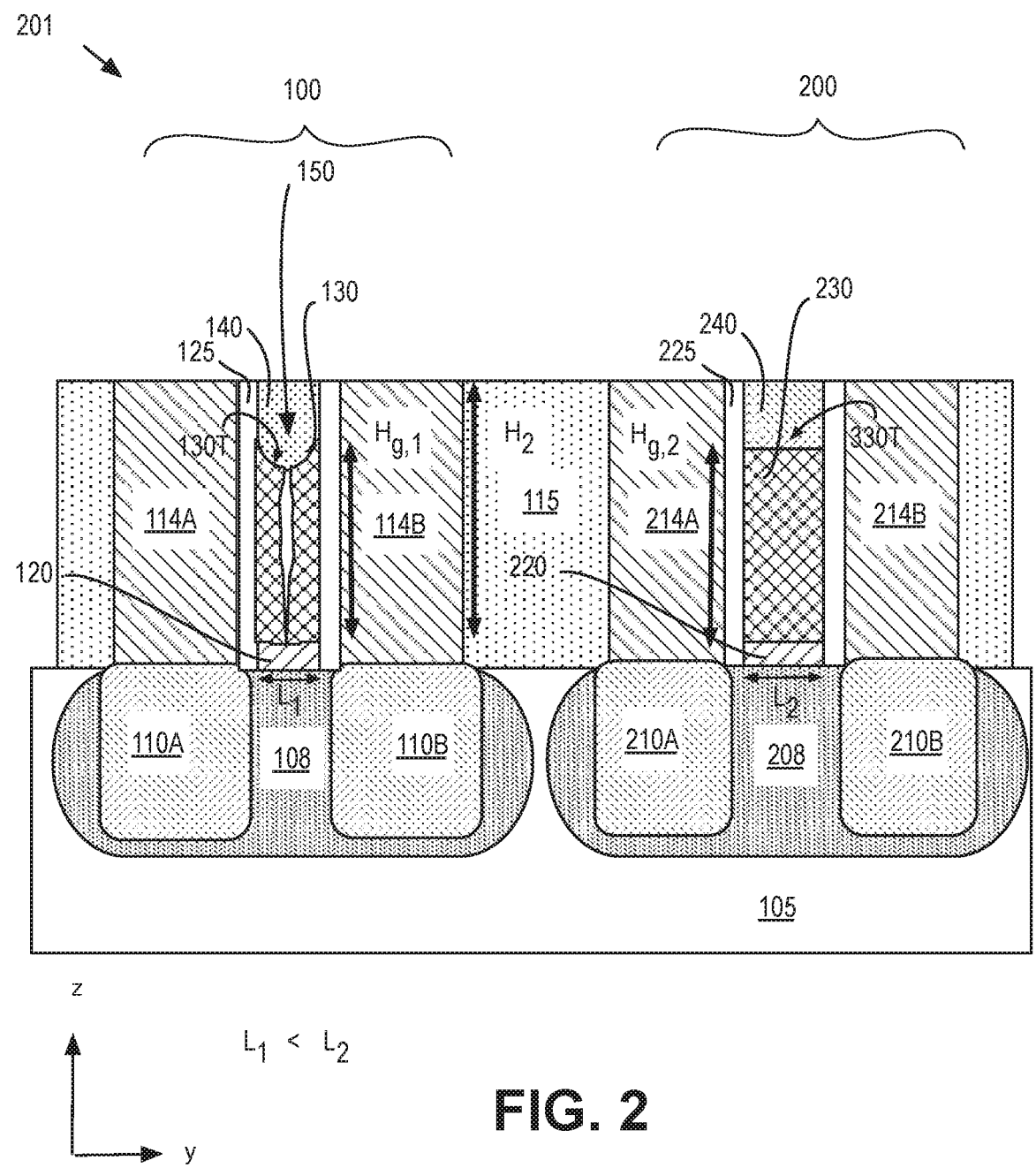
FIG. 2, FIG. 3, and FIG. 4 are cross-sectional views of a MOSFET integrated with a MOS antifuse with void-accelerated breakdown, in accordance with embodiments.

In embodiments, a MOS antifuse bit-cell includes a MOS antifuse with a gate electrode having a seam, and a MOS transistor (e.g., a MOSFET) with a "seam-free," or "seamless," gate electrode. In certain embodiments, a gate electrode seam is a feature dependent on a dimension of a gate electrode. In one such embodiment, an antifuse gate electrode having a nominal gate length below a threshold includes a seam, while a MOSFET gate electrode having a gate length above the threshold is seam-free. FIG. 2 is a cross-sectional view of an antifuse bit-cell 201 that integrates MOS antifuse 100 having void-accelerated breakdown with a MOSFET 200, in accordance with a feature-sized dependent embodiment. MOS antifuse 100 may have any and all of the structural features described above in reference to FIG. 1B. For a functional antifuse bit-cell, a terminal of MOSFET 200 may be coupled, for example by an interconnect metallization layer (not depicted), to antifuse gate electrode 130 or antifuse drain electrode 114B.

MOSFET 200 further includes a semiconductor channel region 208 disposed over a second portion of substrate 105. Semiconductor channel region 208 may have the same conductivity type as that of semiconductor channel 108, or may be of the complementary type. MOSFET 200 further includes a semiconductor source region 210A, and a drain region 210B, each of a conductivity type complementary to channel region 208. Source, drain regions 210A, 210B are disposed over substrate 105 on opposite sides channel region 208, for example as regrown semiconductor regions. In the exemplary embodiment where channel region 208 has the same conductivity type as channel region 108, source and drain regions 210A, 210B have the same conductivity type (e.g., n-type) as source, drain regions 110A, 110B. In a further embodiment, the source and drain regions of bit-cell 201 are all of substantially the same composition (e.g., doped to same impurity level, etc.). MOSFET 200 further includes a source contact 214A interfacing with semiconductor source region 210A, and a drain contact 214B interfacing with semiconductor drain region 210B. In the exemplary embodiment, source, drain contacts 214A, 214B have the same composition as source, drain contacts 114A, 114B. MOSFET 200 further includes a gate dielectric 220. In the exemplary embodiment, gate dielectric 220 has substantially the same EOT as gate dielectric 120 (e.g., to within 10%). In a further embodiment, gate dielectrics 120 and 220 are substantially the same composition and physical thickness. In one advantageous embodiment, both gate dielectrics 120 and 220 include the same high-k dielectric material.

MOSFET 200 further includes a gate electrode 230 separated from channel region 208 by gate dielectric 220. Gate electrode 230 is further separated from the source and drain contacts 214A, 214B by intervening spacer dielectric 225. As illustrated in FIG. 2, gate electrode 230 is seam-free, lacking an equivalent of seam 150. In advantageous embodiments, gate electrode 230 has the same material composition(s) as gate electrode 130. In further embodiments, there is a gate electrode aspect ratio (AR) threshold, above which a seam is present in the gate electrode, and below which the electrode is seamless. Gate electrode 230 may be designed to have a lower AR than gate electrode 130. Advantageously, gate electrode 230 has an AR below the seam threshold, and is therefore seamless. Gate electrode aspect ratio is a function of gate electrode z-height and gate electrode critical dimension (CD). In exemplary embodiments, gate electrode z-height is a function of the z-height of surrounding dielectric materials (e.g., $H_2$) into which gate electrode material is backfilled, and an amount by which a gate electrode is subsequently recessed relative to the surrounding dielectric materials. In the exemplary embodiment depicted, gate electrode 230 has substantially the same "as-deposited" z-height as that of gate electrode 130 because both electrodes are surrounded by a dielectric with z-height $H_2$. Likewise, both gate electrodes 130, 230 are recessed by approximately the same amount as measured at the respective gate electrode sidewalls (e.g., $H_{g,1}=H_{g,2}$). The difference in AR between gate electrode 130 and gate electrode 230 is therefore primarily a function the gate electrode CD defining the MOSFET gate length $L_2$ to be larger than the antifuse gate length $L_1$. Depending on the z-height of surrounding materials, the CD defining $L_2$ may be predetermined to avoid forming a seam during deposition of gate electrode 230, while the same deposition process will form a seam in gate electrode 130 at the CD defining $L_1$. In exemplary embodiments, $L_2$ is at least 3-5 nm larger than $L_1$.

A gate electrode capping material 240 is disposed over seam-free gate electrode 230. In the exemplary embodiment, capping material 240 backfills the recessed top surface between dielectric spacers 225 in the same manner as described for antifuse 100. In advantageous embodiments, capping materials 140 and 240 have the same composition. In further embodiments, MOSFET gate electrode 230 has a top surface that is more planar than a top surface of antifuse gate electrode 130. More specifically, there is little, if any, depression proximate to a centerline of gate electrode 230, relative to a sidewall z-height of gate electrode 230. As illustrated in FIG. 2, gate electrode 230 includes a top electrode surface 230T that is substantially planar, even though top electrode surface 230T is recessed below dielectric spacer 225, contacts 214A, 214B, and isolation dielectric 115. This more planar top gate electrode surface 230T is indicative of a recess etch performed on gate electrode 230 that reduced the gate electrode z-height to $H_{g,2}$ from some greater z-height, such as $H_2$. In absence of a seam, the gate electrode recess etch progresses more uniformly across electrode top surface 230T. Such a planar recessed top gate electrode surface is therefore indicative of a MOS stack that advantageously maintains a high dielectric breakdown voltage (i.e., gate dielectric 220 does not experience an accelerated dielectric breakdown).

In an embodiment, a gate electrode seam is a feature dependent on a process of forming a gate electrode. As described further below, two different deposition techniques may be utilized: one technique to form a MOSFET gate electrode without a seam, and a second technique to form an antifuse gate electrode with a seam that can be exploited to accelerate the antifuse dielectric breakdown. Depending on the techniques utilized, an antifuse gate electrode may have a different composition and/or microstructure than a MOSFET gate electrode integrated onto a same substrate. In one such embodiment, an antifuse gate electrode having a particular composition and/or microstructure includes a seam, while a MOSFET gate electrode having different composition or microstructure is seam-free. FIG. 2 is cross-sectional view of an antifuse bit-cell 301 that integrates a MOS antifuse 100 having void-accelerated breakdown with a MOSFET 300, in accordance with an embodiment employing different deposition processes that impact gate electrode material composition and/or microstructure. MOS antifuse 100 may have any and all of the structural features described above in reference to FIG. 1B. MOSFET 300 may have a terminal coupled, for example by an interconnect metallization layer (not depicted), to antifuse gate electrode 130 or antifuse drain electrode 114B to form an antifuse bit-cell.

MOSFET 300 includes a semiconductor channel region 208 disposed over a second portion of substrate 105. Semiconductor channel region 208 may have the same conductivity type as that of semiconductor channel 108, or may be of the complementary type. MOSFET 300 further includes a semiconductor source region 210A, and a drain region 210B, each of a conductivity type complementary to channel region 208. Source, drain regions 210A, 210B are disposed over substrate 105 on opposite sides channel region 208, for example as regrown semiconductor regions. In the exemplary embodiment where channel region 208 has the same conductivity type as channel region 108, source and drain regions 210A, 210B have the same conductivity type (e.g., n-type) as source, drain regions 110A, 110B. In a further embodiment, the source and drain regions of bit-cell 201 are all of substantially the same composition (e.g., doped to same impurity level, etc.).

MOSFET 300 further includes source contact 214A interfacing with semiconductor source region 210A, and drain contact 214B interfacing with semiconductor drain region 210B. In the exemplary embodiment, source, drain contacts 214A, 214B have the same composition as source, drain contacts 114A, 114B. MOSFET 300 further includes a gate dielectric 220. In the exemplary embodiment, gate dielectric 220 has substantially the same EOT as gate dielectric 120 (e.g., to within 10%). In a further embodiment, gate dielectrics 120 and 220 are substantially the same composition and physical thickness. In one advantageous embodiment, both gate dielectrics 120 and 220 include the same high-k dielectric material.

Figure 3:
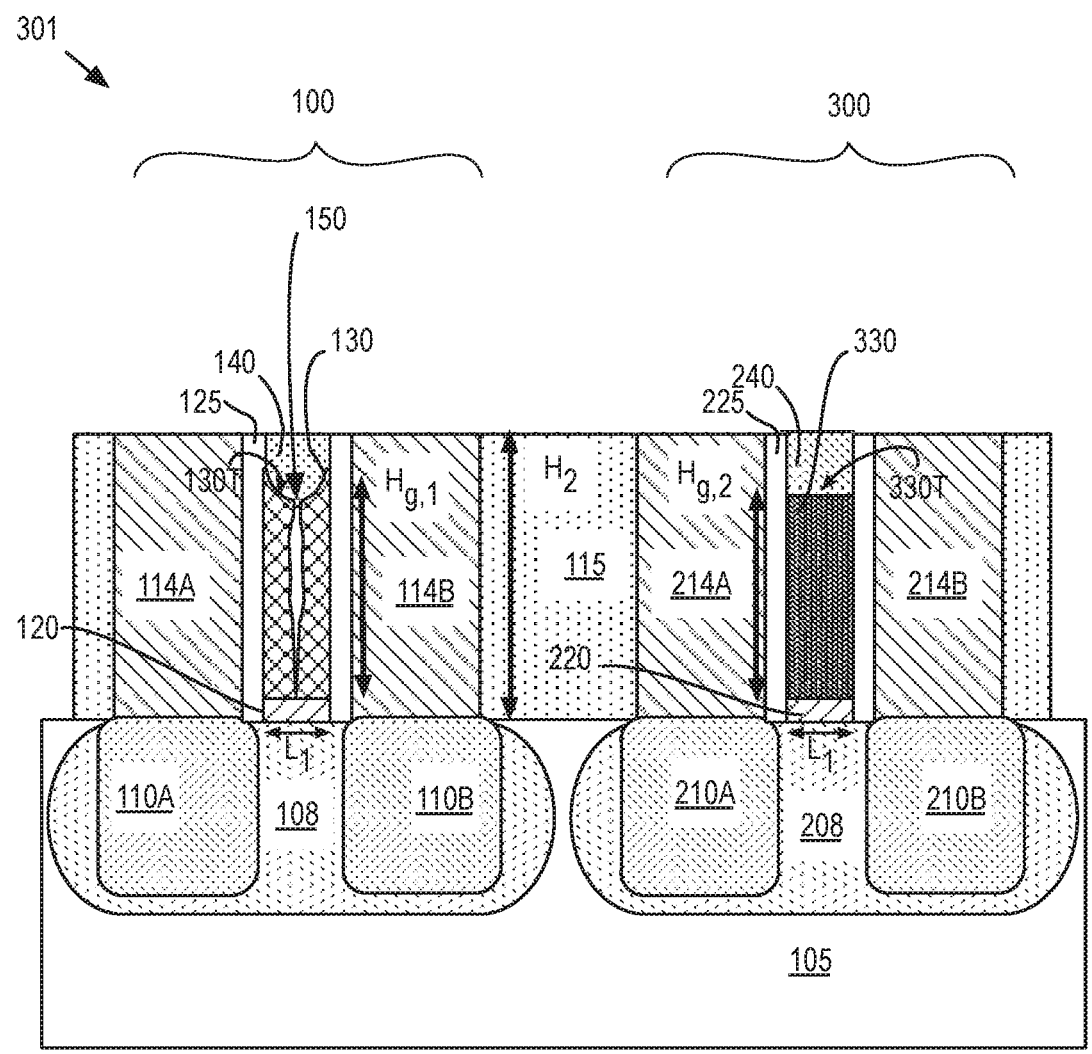

MOSFET 300 further includes a gate electrode 330 separated from channel region 208 by gate dielectric 220, and separated from the source and drain contacts 214A, 214B by spacer dielectric 225. As illustrated in FIG. 3, gate electrode 330 is seam-free, lacking an equivalent of seam 150. In advantageous embodiments, gate electrode 330 has a different material composition(s) than gate electrode 130. In one such embodiment, antifuse gate electrode 130 has a material composition that is suitably deposited by a highly conformal technique, such as atomic layer deposition (ALD), or chemical vapor deposition (CVD). MOSFET gate electrode 230 has a material composition that is suitably deposited by a highly non-conformal technique, and more specifically by a superfilling technique that fills an opening from bottom-up. For example, gate electrode 130 may include any fill material of suitable conductivity that has a known and commercially available CVD or ALD precursor, such as, but not limited to, semiconductors (e.g., polysilicon) and metals/metal alloys (e.g., tungsten, aluminum). Similarly, gate electrode 230 may include any fill material of suitable conductivity that has a known and commercially available superfilling precursor, such as, but not limited to, various metals that may be spun-on or plated from bottom-up. In further embodiments, one or more impurities may be present in gate electrode 230, which are absent in gate electrode 130 (or vice versa). For example, a superfilling process employed to form gate electrode 230 may leave an impurity (e.g., phosphorus, etc.) in gate electrode 230 that is absent in gate electrode 130. In further embodiments, gate electrode 230 has a different material microstructure than gate electrode 130. Microstructure within gate electrode 130 may differ from that of gate electrode 230 even where gate electrodes 130 and 230 have substantially the same composition (e.g., each being of the same metal alloy), as a function of different deposition techniques employed to form each electrode. Differing microstructure includes, but is not limited to, different grain dimensions, different grain shapes, different grain orientations, or different alloy phases.

A gate electrode capping material 240 is disposed over seam-free gate electrode 330. In the exemplary embodiment, capping material 240 backfills the recessed top surface between dielectric spacers 225 in the same manner as described for antifuse 100. In advantageous embodiments, capping materials 140 and 240 have the same composition. In further embodiments, MOSFET gate electrode 330 has a top surface that is more planar than a top surface of antifuse gate electrode 130. More specifically, there is little, if any, depression proximate to a centerline of gate electrode 330, relative to a sidewall z-height of gate electrode 330. As illustrated in FIG. 3, gate electrode 330 includes a top electrode surface 330T that is substantially planar, even though top electrode surface 330T is recessed below spacer dielectric 225, and/or contacts 214A, 214B. This more planar top gate electrode surface 330T is indicative of a recess etch performed on gate electrode 330 that reduced the gate electrode z-height to $H_{g,2}$ from some greater z-height, such as $H_2$. In absence of a seam, the gate electrode recess etch progresses more uniformly across electrode top surface 330T. A planar recessed top gate electrode surface is therefore indicative a MOS stack that advantageously maintains a high dielectric breakdown voltage (i.e., gate dielectric 220 does not experience an accelerated dielectric breakdown).

Figure 4:
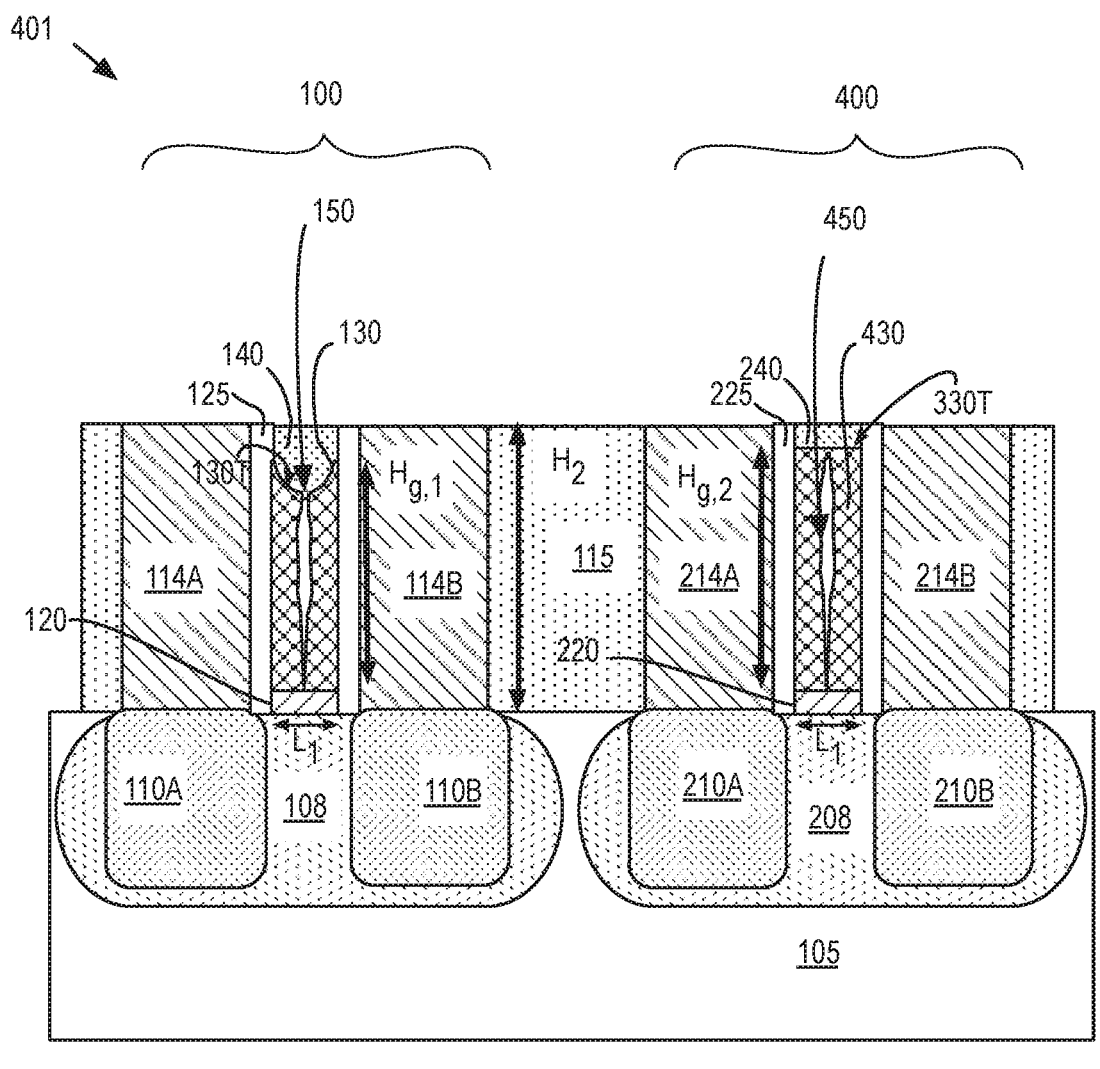

In embodiments, a MOS antifuse bit-cell includes a MOS antifuse and a MOSFET, each further including a gate electrode having a seam. For such embodiments, a differential in the gate dielectric breakdown between the antifuse and MOSFET can be maintained by avoiding a breach of the MOSFET gate electrode seam that might otherwise accelerate the MOSFET gate dielectric breakdown. In an embodiment, the MOSFET gate electrode is not recessed sufficiently to expose a seam present in the MOSFET gate electrode while the antifuse gate electrode is recessed by a greater amount sufficient to expose the seam. FIG. 4 is a cross-sectional view of an antifuse bit-cell 401 that integrates MOS antifuse 100 having void-accelerated breakdown with a MOSFET 400, in accordance with an embodiment employing a selective gate recess. MOS antifuse 100 may have any and all of the structural features described above in reference to FIG. 1B. MOSFET 400 may have a terminal coupled, for example by an interconnect metallization layer (not depicted), to antifuse gate electrode 130 or antifuse drain electrode 114B to form an antifuse bit-cell.

MOSFET 400 further includes a semiconductor channel region 208 disposed over a second portion of substrate 105. Semiconductor channel region 208 may have the same conductivity type as that of semiconductor channel 108, or may be of the complementary type. MOSFET 400 further includes a semiconductor source region 210A, and a drain region 210B, each of a conductivity type complementary to channel region 208. Source, drain regions 210A, 210B are disposed over substrate 105 on opposite sides channel region 208, for example as regrown semiconductor regions. In the exemplary embodiment where channel region 208 has the same conductivity type as channel region 108, source and drain regions 210A, 210B have the same conductivity type (e.g., n-type) as source, drain regions 110A, 110B. In a further embodiment, the source and drain regions of bit-cell 401 are all of substantially the same composition (e.g., doped to same impurity level, etc.). MOSFET 400 further includes a source contact 214A interfacing with semiconductor source region 210A, and a drain contact 214B interfacing with semiconductor drain region 210B. In the exemplary embodiment, source, drain contacts 214A, 214B have the same composition as source, drain contacts 114A, 114B. MOSFET 400 further includes a gate dielectric 220. In the exemplary embodiment, gate dielectric 220 has substantially the same EOT as gate dielectric 120 (e.g., to within 10%). In a further embodiment, gate dielectrics 120 and 220 are substantially the same composition and physical thickness. In one advantageous embodiment, both gate dielectrics 120 and 220 include the same high-k dielectric material.

MOSFET 400 further includes a gate electrode 430 separated from channel region 208 by gate dielectric 220. Gate electrode 430 is further separated from the source and drain contacts 214A, 214B by spacer dielectric 225. As illustrated in FIG. 4, gate electrode 430 includes seam 450, similar to seam 150 present in gate electrode 130. In advantageous embodiments, gate electrode 430 has the same material composition(s) as gate electrode 130 and the same CD (e.g., gate length of $L_1$). Gate electrode 130 is recessed to $H_{g,1}$ which is sufficient to open seam 150. However, gate electrode 430 is recessed to a z-height $H_{g,2}$ that is greater than gate electrode height $H_{g,1}$. Seam 450 remains occluded by gate electrode material such that seam 450 remains a keyhole or a void contained within gate electrode 430. This gate electrode is indicative of a MOS stack having a high dielectric breakdown threshold (i.e., not void-accelerated in the manner of antifuse 100).

A gate electrode capping material 240 is disposed over gate electrode 430. In the exemplary embodiment, capping material 240 backfills the recessed top surface between dielectric spacers 225 in the same manner as described for antifuse 100. In advantageous embodiments, capping materials 140 and 240 have the same composition. Capping material 240 is of reduced thickness to account for greater z-height of gate electrode 430 and maintain planarity with surrounding dielectrics and/or contact metallizations. In further embodiments, MOSFET gate electrode 430 has a top surface that is more planar than a top surface of antifuse gate electrode 130. More specifically, there is little, if any, depression proximate to a centerline of gate electrode 430, relative to a sidewall z-height of gate electrode 430. As illustrated in FIG. 4, gate electrode 430 includes a top electrode surface 430T that is substantially planar, even though top electrode surface 430T is recessed below spacer dielectric 225, and contacts 214A, 214B. The more planar top gate electrode surface 430T is indicative of a recess etch performed on gate electrode 430 that reduced the gate electrode z-height to $H_{g,2}$ from some greater z-height, such as $H_2$. However, because seam 450 is not open to top electrode surface 430T, the gate electrode recess etch progresses more uniformly across electrode top surface 430T. Such a planar recessed top gate electrode surface is therefore indicative a MOS stack that advantageously maintains a high dielectric breakdown voltage (i.e., gate dielectric 220 does not experience an accelerated dielectric breakdown).

Figure 5A:
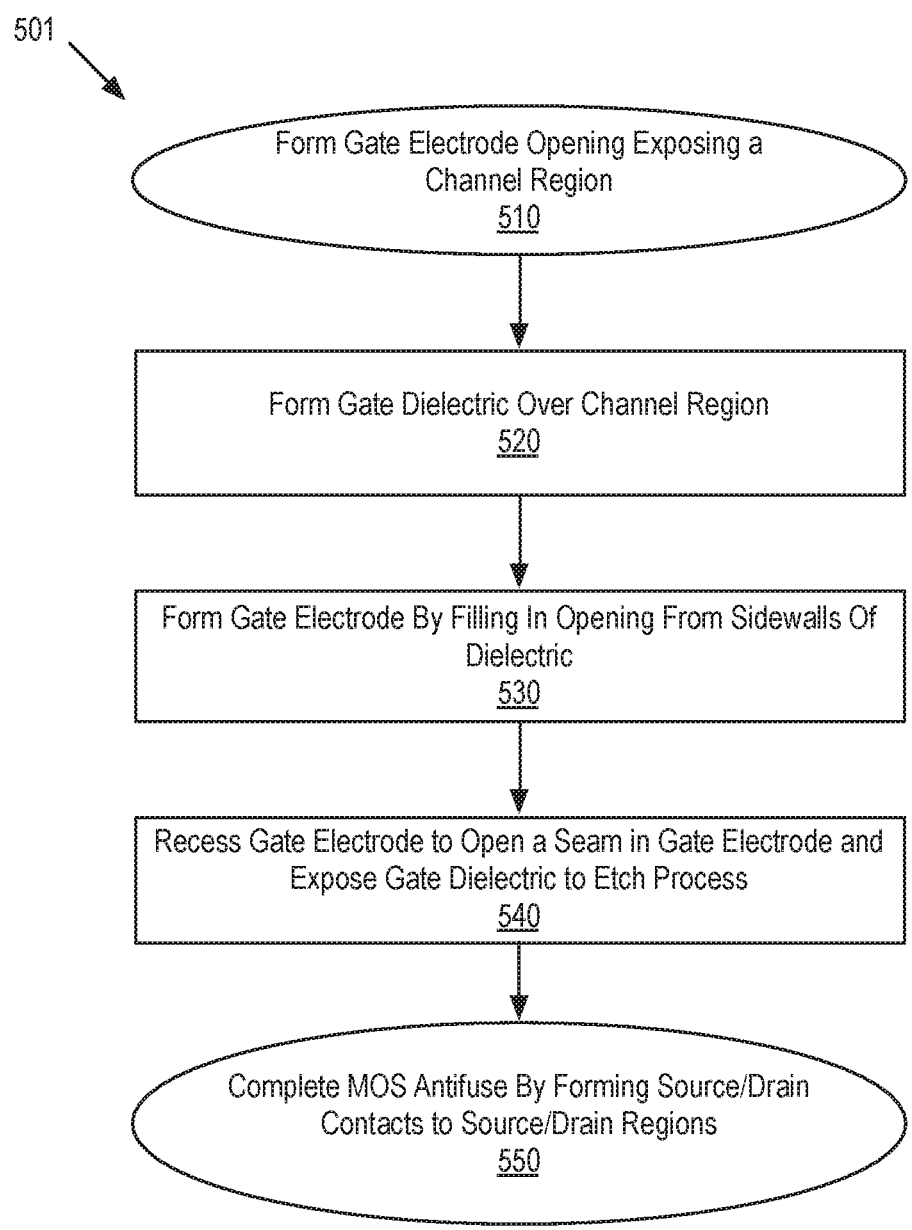
FIG. 5A is a flow diagram illustrating a method of forming a MOS antifuse with void-accelerated breakdown, in accordance with an embodiment.

MOS antifuse structures with void-accelerated gate dielectric breakdown and IC structures (e.g., antifuse bitcells) integrating such an antifuse along with MOSFETS may be fabricated with a wide variety of techniques. FIG. 5A is a flow diagram illustrating a method 501 of forming a MOS antifuse with void-accelerated breakdown, in accordance with an embodiment. Method 501 may be practiced to fabricate antifuse 100 illustrated in FIG. 1B, for example.

Method 501 begins with forming an opening in dielectric material layer(s) at operation 510. The opening exposes a semiconductor channel region of a substrate. Any known technique(s) may be practiced at operation 510 to form an opening into which a gate electrode is to be subsequently deposited. One technique includes removing a sacrificial gate electrode from a surrounding structure, as described further below in the context of FIG. 5B and FIG. 6A. Other techniques such as, but not limited to, patterned etching of a blanket dielectric film, may also be practiced. Thickness or z-height of the surrounding dielectric and CD of the opening may be selected to induce formation of a seam during the subsequent backfilling of a gate electrode material into the opening. In one exemplary embodiment, an AR of the opening formed at operation 510 is greater than 1:1, and advantageously greater than 2:1.

At operation 520, a gate dielectric layer is formed over the semiconductor channel region exposed within the opening that was formed at operation 510. Any known gate dielectric formation process may be employed at operation 520 (e.g., thermal oxidation, CVD, and ALD) to form any material known to be suitable as a MOS dielectric. In advantageous embodiments, operation 520 entails deposition of a high-k material by ALD.

Method 501 continues at operation 530 with formation of a gate electrode within the opening formed at operation 510. In advantageous embodiments, the gate electrode is formed by filling in the opening from sidewalls of the surrounding dielectric. In exemplary embodiments, operation 530 entails depositing a gate electrode material with a highly conformal process, such as, but not limited to, CVD and ALD. The conformal process forms a seam in the gate electrode.

Method 501 continues at operation 540 where the gate electrode material deposited at operation 530 is recessed to open the seam in the gate electrode. The opened seam may further expose the gate dielectric formed at operation 520 to the recess etch process employed at operation 540 (and to any subsequent process environment until the gate electrode seam is occluded). Operation 540 may entail one or more known recess etch process as a function of the gate electrode composition. In an advantageous embodiment, operation 540 includes a plasma-based recess etch. In further embodiments, operation 540 entails planarization of the gate electrode material to remove gate electrode material overburden followed by a plasma-based or wet chemical-based recess etch. Such embodiments are further described below in the context of FIG. 5B. Method 501 ends at operation 550 where the MOS antifuse is completed by forming source/drain regions, and forming source/drain contacts to the source/drain regions, with any known technique(s).

Figure 5B:
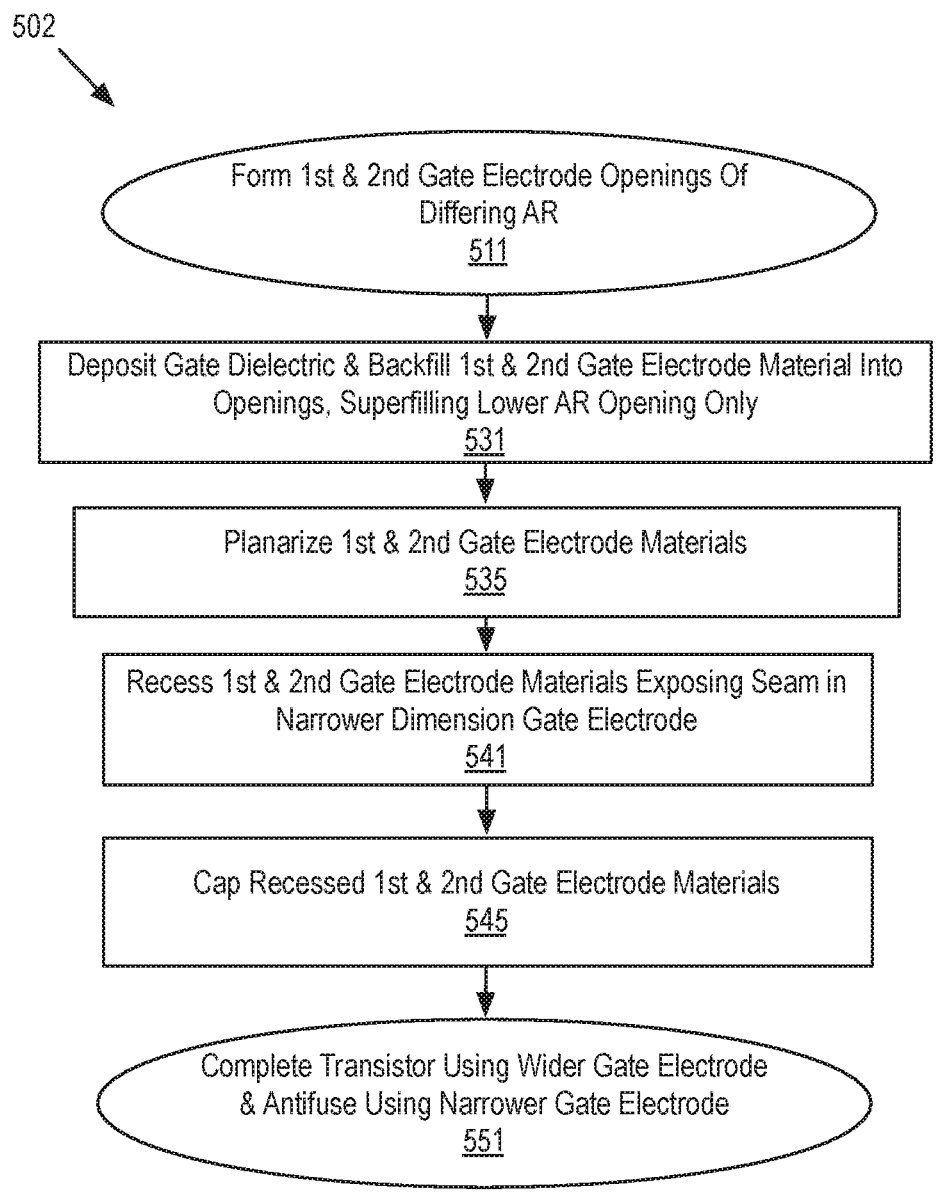
FIG. 5B is a flow diagram illustrating a method of forming a MOSFET and MOS antifuse with void-accelerated breakdown, in accordance with an embodiment.
Figure 6A:
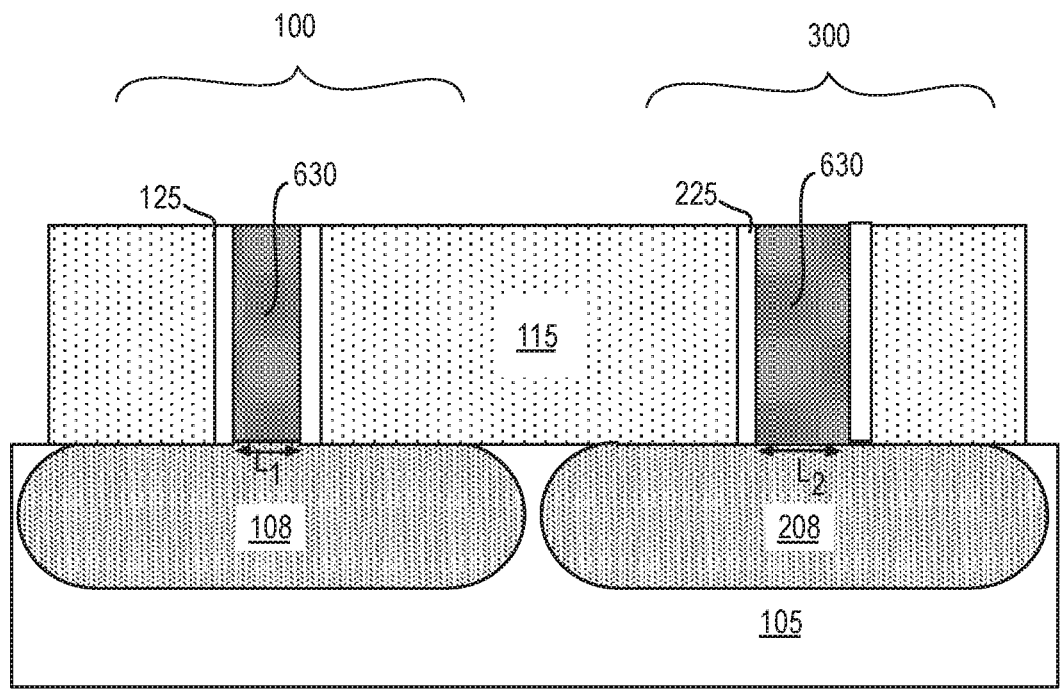
FIGS. 6A, 6B, 6C, 6D, 6E, 6F, and 6G are cross-sectional views of a MOSFET integrated with a MOS antifuse having void-accelerated breakdown evolving as selected operations in the method depicted in FIG. 5C are performed, in accordance with an embodiment.
Figure 6B:
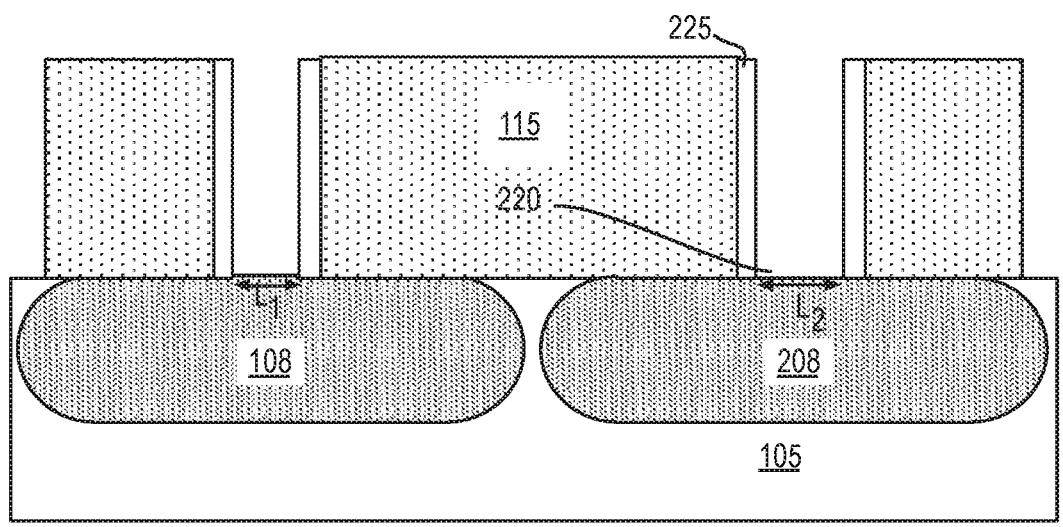
Figure 6C:
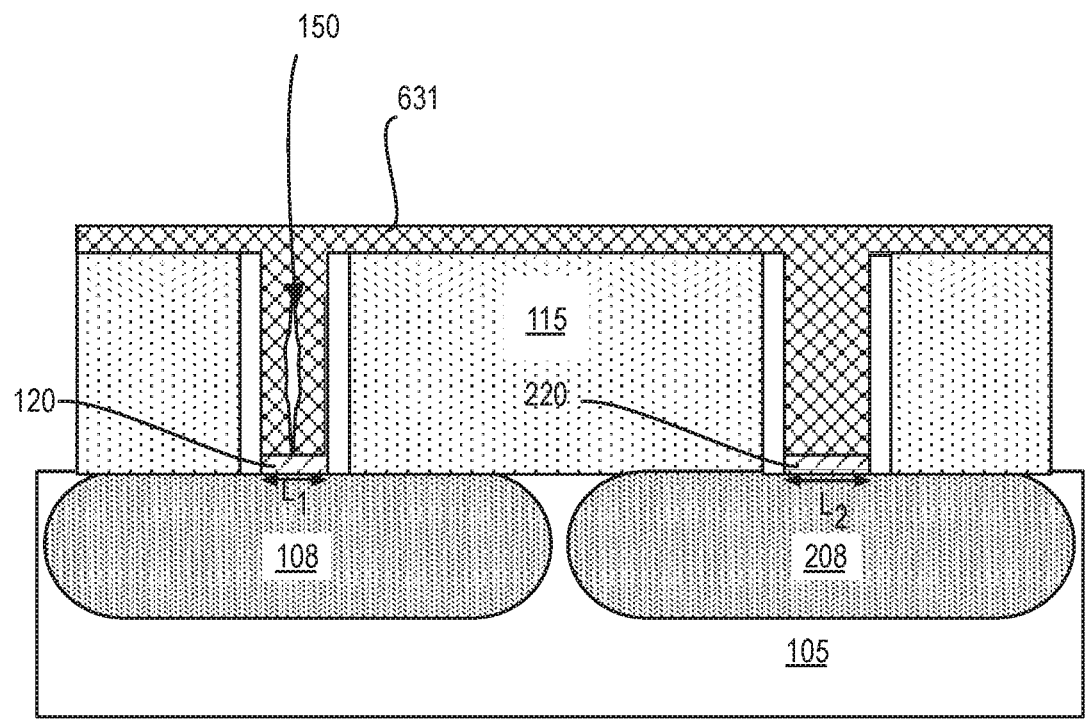

FIG. 5B is a flow diagram illustrating a method 502 of forming a MOSFET integrated with a MOS antifuse having void-accelerated breakdown, in accordance with an embodiment. Method 502 may be practiced to fabricate antifuse 100 and MOSFET 201 illustrated in FIG. 2, for example. Certain operations described in the context of method 502 are further illustrated in FIG. 6A-6G. FIG. 6A-6G are cross-sectional views of an antifuse with void-accelerated dielectric breakdown and a MOSFET without void-accelerated dielectric breakdown evolving as selected operations in method 502 are performed, in accordance with advantageous embodiments. Reference numbers introduced in FIG. 2. are retained for corresponding structures illustrated in FIG. 6A-6G. The various operations illustrated in more detail by FIG. 6A-6G may be similarly employed in corresponding operations in method 501 above, as well as in method 503 described further below.

Referring to FIG. 5B, method 502 begins with forming first and second openings in dielectric material layer(s) at operation 511. The openings expose two separate semiconductor channel regions of a substrate. Any known techniques may be practiced at operation 511 to form the openings into which a gate electrode is to be subsequently deposited. One technique includes concurrently removing two sacrificial gate electrodes from a surrounding structure. In the exemplary embodiment illustrated in FIG. 6A, a gate replacement process is performed beginning with formation of sacrificial gate structures 630 over channel semiconductor regions 108, 208. Sacrificial gate structures 630 may be fabricated with any known technique. In one embodiment a sacrificial material, such as, but not limited to polysilicon is deposited over the substrate and patterned to form a plurality of sacrificial gate structures. Any suitable deposition technique may be utilized, such as, but not limited to chemical vapor deposition (CVD), or atomic layer deposition (ALD). In one exemplary embodiment polysilicon is deposited by CVD. Any suitably anisotropic etch may be utilized to pattern the sacrificial material. Dielectric spacer(s) 125, 225 are formed. Any suitable dielectric material, such as, but not limited to SiO, SiON, SiN, SiOC, etc., may be deposited using any known technique, such as, but not limited to chemical vapor deposition (CVD), or atomic layer deposition (ALD). The dielectric material deposition is advantageously conformal. An anisotropic etch may then clear the dielectric material leaving only spacer dielectric 125, 225 self-aligned to topographic steps. In the exemplary embodiment illustrated in FIG. 6A, spacer dielectric 125, 225 is self-aligned to edges of sacrificial gate structures 630. Isolation dielectric 115 is formed around sacrificial gate structures 630. Any deposition process may be employed to form dielectric material 115, such as, but not limited to, CVD, and spin-on processes. For deposition processes that are non-planarizing, the deposited dielectric may be planarized, for example by chemical-mechanical polish (CMP) to expose top surfaces of the sacrificial gate features. Sacrificial gate features are then removed, as further illustrated in FIG. 6B. Any conventional etch process, such as, but not limited to a wet chemical etch, or dry plasma etch, may be utilized to remove one or more sacrificial gate structure selectively to the surrounding dielectric. In alternate embodiments, the formation of isolation dielectric 115 and removal of sacrificial gate structures 630 may precede the formation of spacer dielectric 125, 225.

Returning to FIG. 5B, the thickness or z-height of the surrounding dielectric and CD of a first of the gate electrode openings may be selected to induce formation of a seam during the subsequent deposition of a gate electrode material into the first opening. In one exemplary embodiment, an AR of a first opening formed at operation 511 is greater than 1:1, and advantageously greater than 2:1 while a second opening formed at operation 511 is less than 2:1, and advantageously no greater than 1:1. In one exemplary embodiment, a first opening of a smaller CD and a second opening of a larger CD are formed into a surrounding dielectric of a substantially uniform thickness or z-height.

Method 502 continues at operation 531 where a gate dielectric is formed in each of the first and second openings that were formed at operation 511. Any known gate dielectric formation process may be employed at operation 531 (e.g., thermal oxidation, CVD, and ALD) to form any material known to be a suitable MOS dielectric. In an advantageous embodiment further illustrated by FIG. 6C, a high-k gate dielectric material 120 and 220 is deposited by ALD. Although not depicted, gate dielectric material 120 and 220 may also form on sidewalls of spacer dielectric 125, 225. Gate electrode material(s) 630 then concurrently backfills the first and second openings. With an appropriate AR of the first and second openings, superfilling occurs only for the opening of lower AR. During gate electrode deposition, seam 150 forms as the gate electrode material 631 is backfilled into the first opening, which because of the higher AR (e.g., narrower CD associated with gate length $L_1$), advances more conformally than for the second opening. In other words, gate electrode material 631 fills in from sidewalls of the surrounding dielectric at a more substantial rate relative to the rate of deposition at the bottom of the opening for the narrower first opening than for the wider second opening (associated with gate length $L_2$).

Figure 6D:
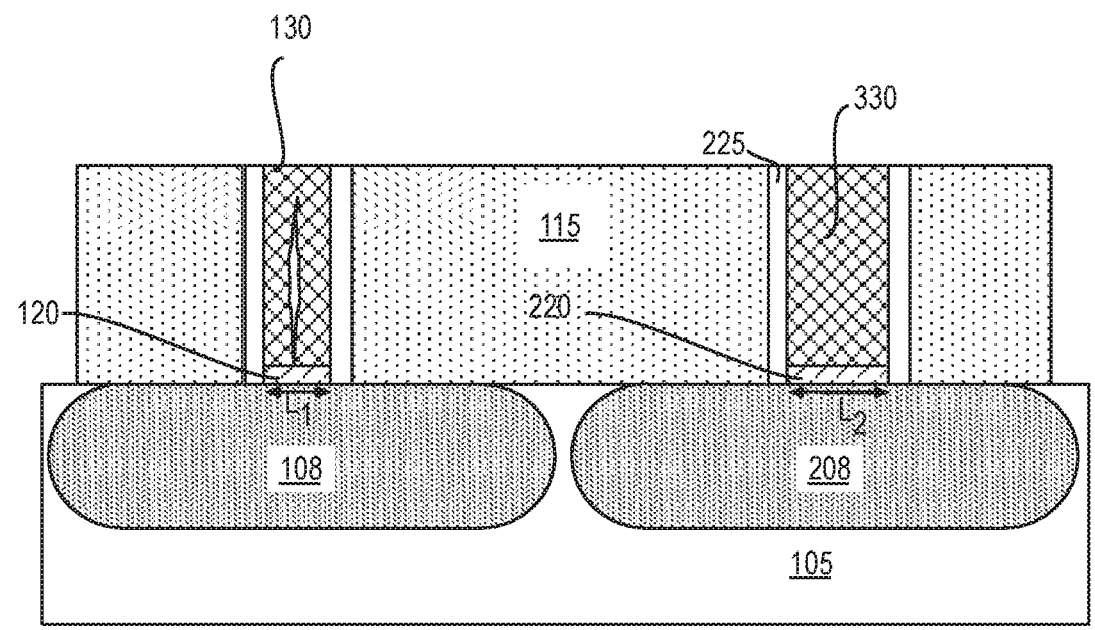

Returning to FIG. 5B, method 502 continues with operation 535, where gate electrode material(s) is planarized by any known technique (e.g. CMP), as further illustrated in FIG. 6D. Planarization may remove gate electrode material overburden and expose isolation dielectric 115 and/or any intervening dielectric materials (e.g., spacer dielectric 125, 225). Method 502 (FIG. 5B) continues at operation 541, where the first and second electrodes 130, 330 are recessed below the surrounding dielectric using any known technique. In an advantageous embodiment further illustrated in FIG. 6E, a plasma-based gate electrode recess etch 650 is performed. Recess etching is performed to reduce the z-height of gate electrode 130 enough to expose seam 150. Upon removing any overlying gate electrode material occluding seam 150, seam 150 is exposed to plasma-based recess etch 650. Seam 150 then offers an additional etch front extending along the seam z-height. Accelerated recess etching is localized along the etch front presented by seam 150, causing a non-planarity in the top surface gate electrode 130. Also through seam 150, the underlying gate dielectric 120 can be subjected to damage that has been found to accelerate the electrical breakdown of gate dielectric 120. This damage may be incurred during the electrode recess etch, or during subsequent processing until seam 150 is again occluded with an overlying material.

Figure 6E:
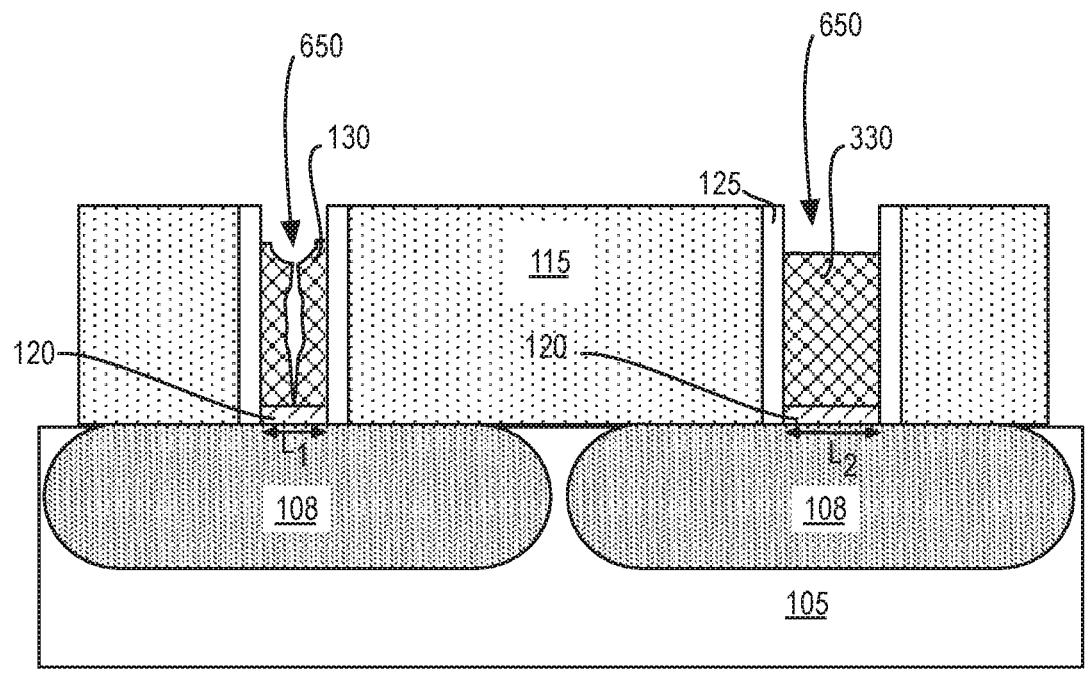
Figure 6F:
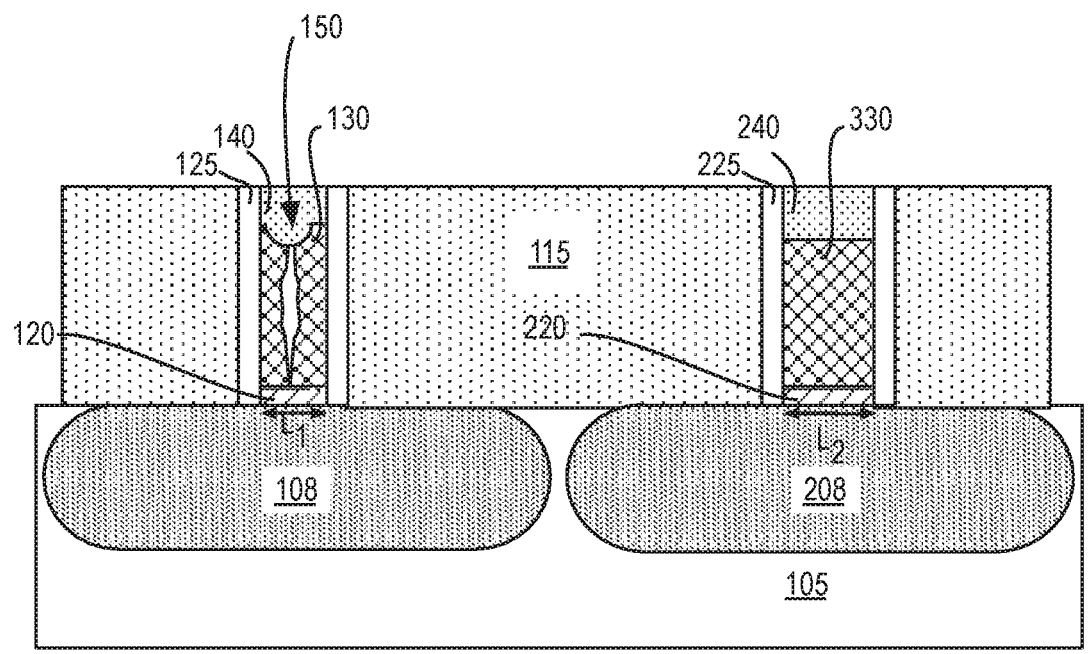
Figure 6G:
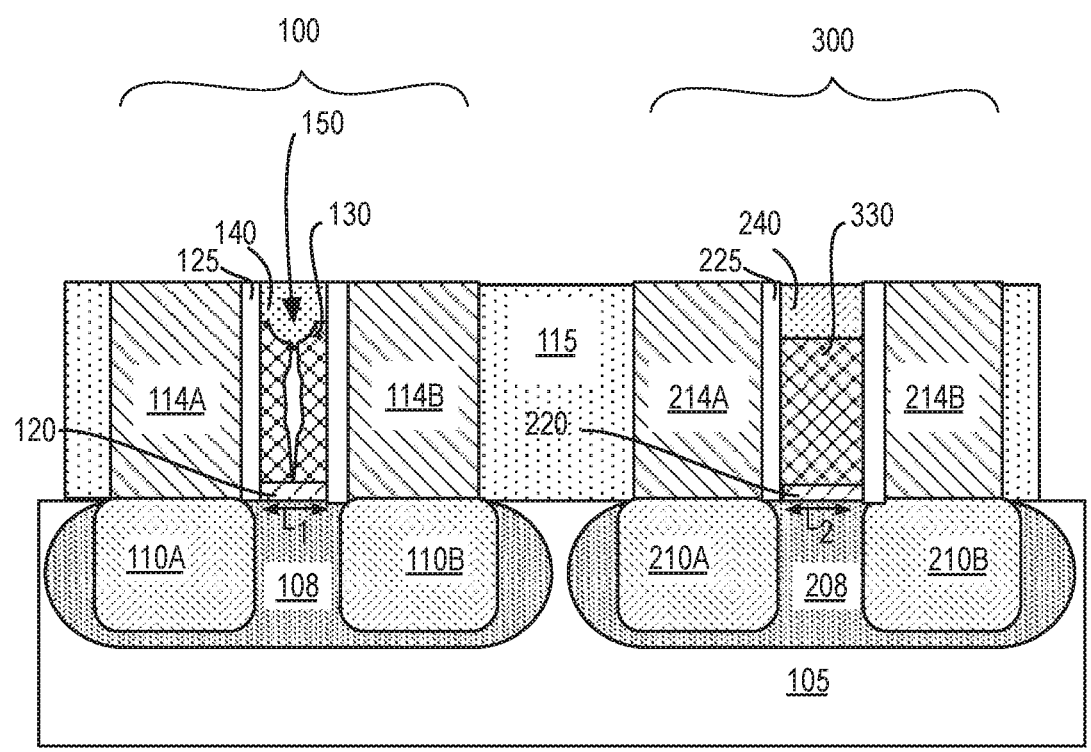

Returning to FIG. 5B, method 502 proceeds to operation 545 where a capping material is deposited over the recessed surface of the first and second gate electrodes. Any known technique, such as a self-planarizing spin-on deposition, or a non-planarizing vapor deposition may be utilized at operation 545. Non-planarizing deposition embodiments may further include a subsequent planarization (e.g., CMP) operation. Method 502 ends at operation 551 where the MOS transistor is completed based on the wider gate electrode, and the MOS antifuse is completed based on the narrower gate electrode. The antifuse bit-cell illustrated in FIG. 6E is then ready for upper level interconnection of MOSFET 300 and antifuse 100.

Figure 5C:
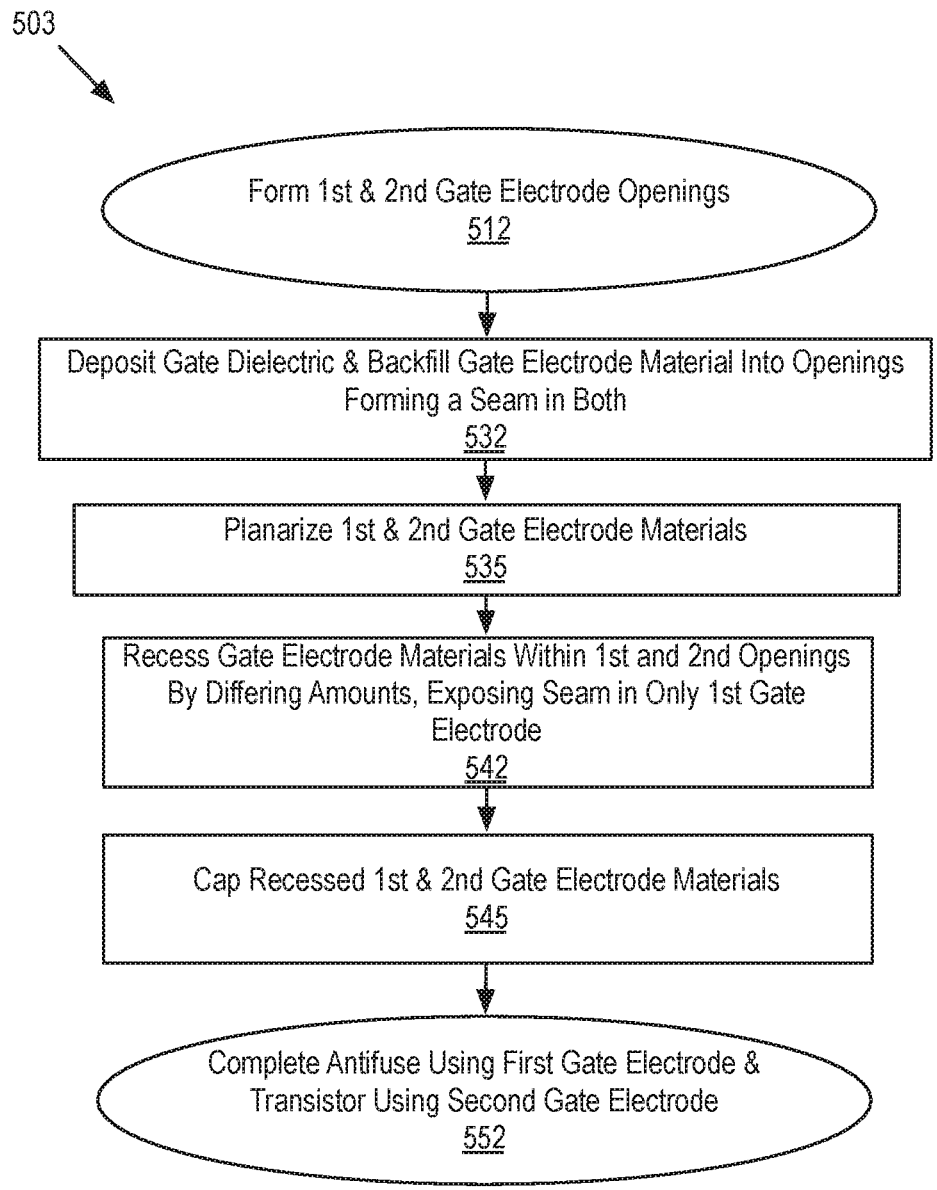
FIG. 5C is a flow diagram illustrating a method of forming a MOSFET and MOS antifuse with void-accelerated breakdown, in accordance with an embodiment.

FIG. 5C is a flow diagram illustrating a method 503 of integrating a MOSFET with a MOS antifuse having void-accelerated breakdown, in accordance with another embodiment. Method 503 may be practiced to fabricate antifuse 100 and MOSFET 401 illustrated in FIG. 4, for example. Method 503 begins with forming first and second openings in dielectric material layer(s) at operation 512. The openings expose two separate semiconductor channel regions of a substrate. Any known techniques may be practiced at operation 512 to form the openings into which a gate electrode is to be subsequently deposited. One technique includes concurrently removing two sacrificial gate electrodes from a surrounding structure, as described above in the context of FIG. 5B. Other techniques such as, but not limited to, patterned etching of a blanket dielectric film, may also be practiced. Thickness or z-height of the surrounding dielectric, and CD of both the first second openings may be selected to induce formation of a seam during the subsequent deposition of a gate electrode material into the openings. In one exemplary embodiment, an AR of both the first and second openings formed at operation 512 is greater than 1:1, and advantageously greater than 2:1. In one exemplary embodiment, the CD of both the first and second openings is the substantially same (e.g., within normal variation of a same target CD).

Method 503 continues at operation 532 where a gate dielectric is formed in each of the openings that were formed at operation 512. Any known gate dielectric formation process may be employed at operation 532 (e.g., thermal oxidation, CVD, and ALD) to form any material known to be suitable as a MOS dielectric. In advantageous embodiments, operation 532 entails deposition of a high-k material by ALD. Operation 532 further includes concurrently backfilling a gate electrode material (or plurality of materials) into the first and second openings, respectively. During gate electrode deposition, a seam forms as the gate electrode material is backfilled into both the first and second openings, advancing conformally and filling in from sidewalls of the surrounding dielectric.

Method 503 continues with operation 535, where gate electrode material(s) are planarized by any known technique (e.g. CMP). At operation 542, the first and second electrodes are then recessed below the surrounding dielectric by differing amounts using any known technique. In advantageous embodiments, a plasma-based gate electrode recess etch is performed for a first duration during which the gate electrode material disposed in the second opening is protected, for example with a mask. In further embodiments, after the mask is removed, a second plasma-based gate electrode recess etch is performed for a second duration. The total gate electrode recess etch time is sufficient to expose the seam present in the first opening, subjecting the underlying gate dielectric to damage that has been found to accelerate the film's electrical breakdown. The second gate electrode recess etch duration is insufficient to expose the seam present in the second opening, maintaining a high MOS dielectric breakdown threshold.

At operation 545, a capping material is deposited over the recessed surface of the first and second gate electrodes. Any known technique, such as a self-planarizing spin-on deposition, or a non-planarizing vapor deposition may be utilized at operation 545. Non-planarizing deposition embodiments may further include a subsequent planarization (e.g., CMP) operation. Method 503 ends at operation 552 where the MOS transistor is completed based on the second MOS stack with higher dielectric breakdown strength, and the MOS antifuse is completed based on the MOS stack with void-accelerated dielectric breakdown.

Figure 7:
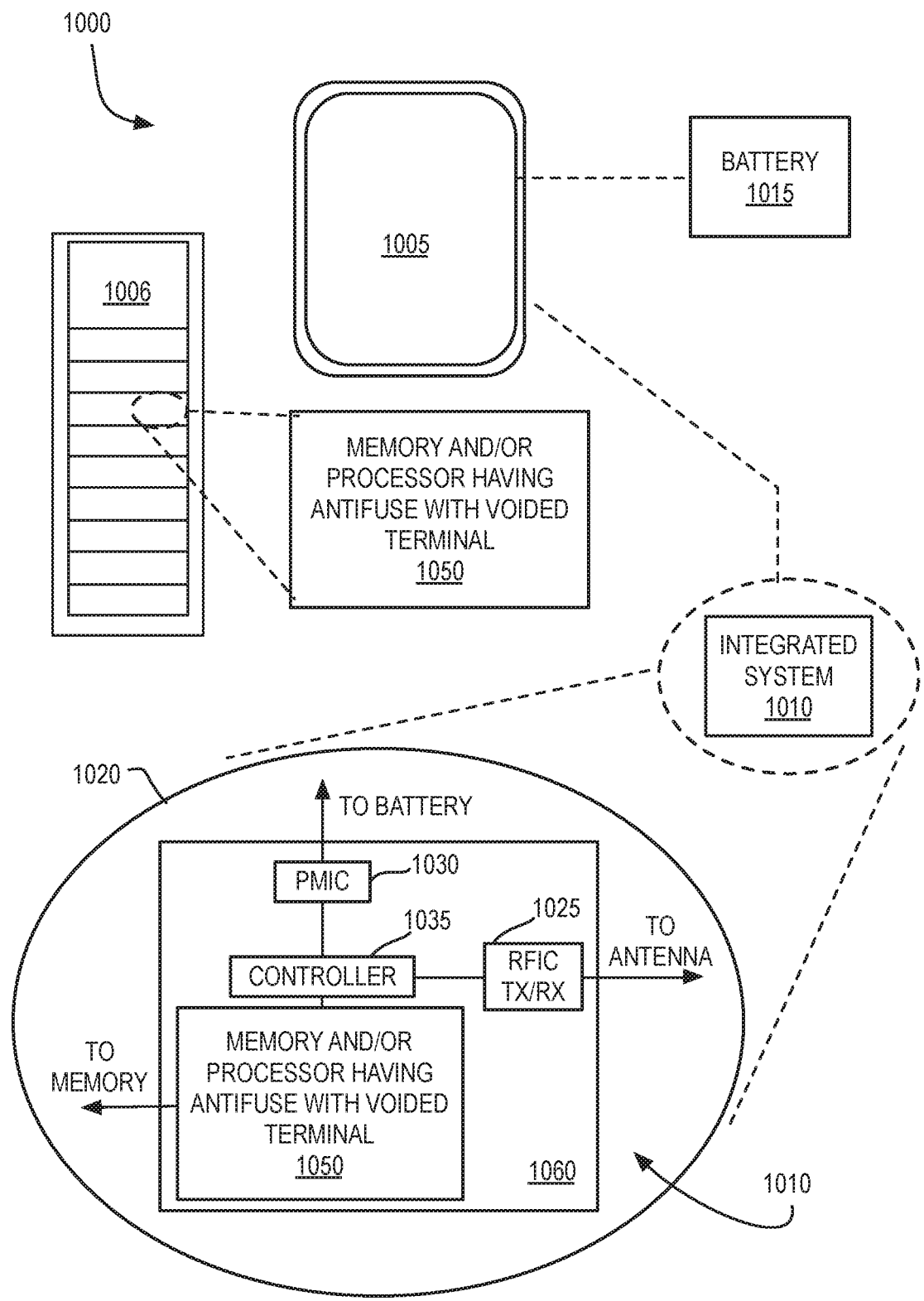
FIG. 7 illustrates a mobile computing platform and a data server machine employing a MOS antifuse with void-accelerated breakdown in accordance with embodiments of the present invention.

FIG. 7 illustrates a system 1000 in which a mobile computing platform 1005 and/or a data server machine 1006 employs a MOS antifuse with void-accelerated gate dielectric breakdown in accordance with embodiments of the present invention. The server machine 1006 may be any commercial server, for example including any number of high-performance computing platforms disposed within a rack and networked together for electronic data processing, which in the exemplary embodiment includes a packaged monolithic IC 1050. The mobile computing platform 1005 may be any portable device configured for each of electronic data display, electronic data processing, wireless electronic data transmission, or the like. For example, the mobile computing platform 1005 may be any of a tablet, a smart phone, laptop computer, etc., and may include a display screen (e.g., a capacitive, inductive, resistive, touchscreen), a chip-level or package-level integrated system 1010, and a battery 1015.

Whether disposed within the integrated system 1010 illustrated in the expanded view 1020, or as a stand-alone packaged chip within the server machine 1006, packaged monolithic IC 1050 includes a memory chip (e.g., RAM), or a processor chip (e.g., a microprocessor, a multi-core microprocessor, graphics processor, or the like) employing a monolithic architecture with at least one antifuse with void-accelerated gate dielectric breakdown. Advantageously, integrated system 1010 includes a MOS antifuse bit-cell where the MOS antifuse has void-accelerated gate dielectric breakdown and a MOSFET maintains a higher nominal gate dielectric breakdown, for example as describe elsewhere herein. The monolithic IC 1050 may be further coupled to a board, a substrate, or an interposer 1060 along with, one or more of: a power management integrated circuit (PMIC) 1030; RF (wireless) integrated circuit (RFIC) 1025 including a wideband RF (wireless) transmitter and/or receiver (TX/RX) (e.g., including a digital baseband and an analog front end module further comprises a power amplifier on a transmit path and a low noise amplifier on a receive path); and a controller thereof 1035.

Functionally, PMIC 1030 may perform battery power regulation, DC-to-DC conversion, etc., and so has an input coupled to battery 1015 and with an output providing a current supply to other functional modules. As further illustrated, in the exemplary embodiment, RFIC 1025 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of the monolithic IC 1050 or within a single IC coupled to the package substrate of the monolithic IC 1050.

Figure 8:
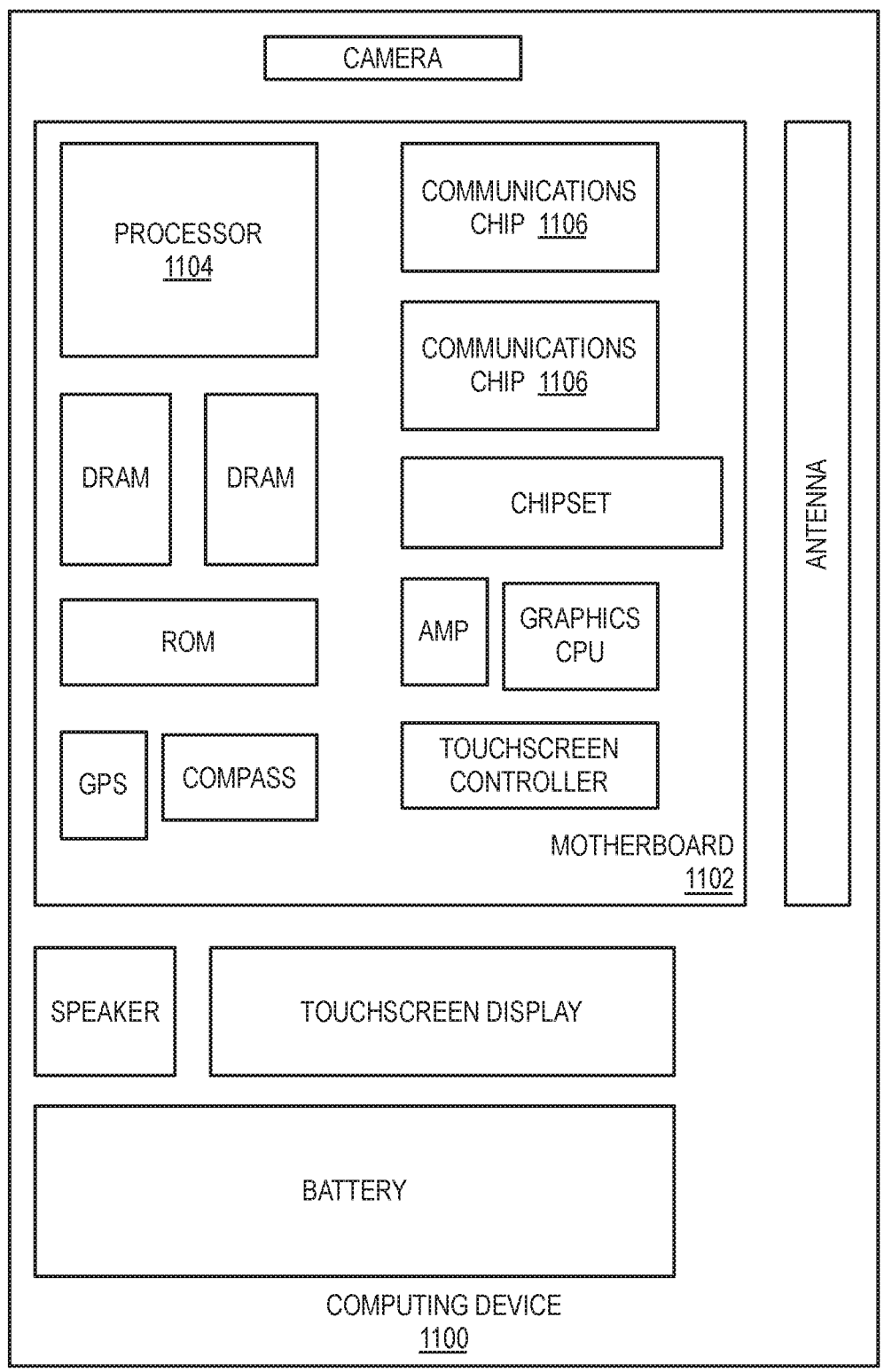
FIG. 8 is a functional block diagram of an electronic computing device, in accordance with an embodiment of the present invention.

FIG. 8 is a functional block diagram of a computing device 1100, arranged in accordance with at least some implementations of the present disclosure. Computing device 1100 may be found inside platform 1005 or server machine 1006, for example. Device 1100 further includes a motherboard 1102 hosting a number of components, such as but not limited to a processor 1104 (e.g., an applications processor), which may further incorporate a MOS antifuse with void-accelerated gate dielectric breakdown, for example as discussed elsewhere herein. Processor 1104 may be physically and/or electrically coupled to motherboard 1102. In some examples, processor 1104 includes an integrated circuit die packaged within the processor 1104. In general, the term "processor" or "microprocessor" may refer to any device or portion of a device that processes electronic data from registers and/or memory to transform that electronic data into other electronic data that may be further stored in registers and/or memory.

In various examples, one or more communication chips 1106 may also be physically and/or electrically coupled to the motherboard 1102. In further implementations, communication chips 1106 may be part of processor 1104. Depending on its applications, computing device 1100 may include other components that may or may not be physically and electrically coupled to motherboard 1102. These other components include, but are not limited to, volatile memory (e.g., DRAM), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid-state drive (SSD), compact disk (CD), digital versatile disk (DVD), and so forth), or the like.

Communication chips 1106 may enable wireless communications for the transfer of data to and from the computing device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1106 may implement any of a number of wireless standards or protocols, including but not limited to those described elsewhere herein. As discussed, computing device 1100 may include a plurality of communication chips 706. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. The above embodiments may include specific combination of features. For example:

In one or more first embodiment, a metal-oxide-semiconductor (MOS) antifuse bit-cell includes an antifuse further including a first semiconductor channel region disposed over a substrate. The antifuse further includes a first semiconductor source region and a first drain region, of a conductivity type complementary to the first channel region, disposed over the substrate and on opposite sides of the first channel region. The antifuse further includes a first source contact interfacing with the first source region and a first drain contact interfacing with the first drain region. The antifuse further includes a first gate dielectric disposed over the first channel region. The antifuse further includes a first gate electrode separated from the first channel region by the first gate dielectric and separated from the first drain and source contacts by an intervening dielectric material, the first gate electrode having a seam extending from a top surface of the first gate electrode through a z-height approaching the first gate dielectric.

In furtherance of the first embodiment, the first gate electrode has a first gate length. The seam in the first gate electrode material is disposed at approximately the center of the first gate length.

In furtherance of the first embodiment, the antifuse bit-cell of claim 1 further includes a MOS transistor coupled to the first gate electrode or to the first drain contact. The transistor further includes a second semiconductor channel region disposed over the substrate. The transistor further includes a second semiconductor source region and a second drain region, of a conductivity type complementary to the second channel region, disposed over the substrate and on opposite sides of the second channel region. The transistor further includes a second source contact interfacing with the second source region and a second drain contact interfacing with the second drain region. The transistor further includes a second gate dielectric disposed over the second channel region. The transistor further includes a second gate electrode separated from the second channel region by the second gate dielectric and separated from the second source and drain contacts by the intervening dielectric material, wherein the second gate electrode is seam-free.

In furtherance of the embodiment immediately above, the first gate electrode has a first gate length. The seam in the first gate electrode material disposed at approximately the center of the first gate length. The z-height of the first gate electrode is less than z-height of the intervening dielectric material. The second gate electrode has a second gate length, larger than the first gate length. The first and second gate electrode have substantially the same material composition.

In furtherance of the embodiment above, the first gate electrode has a first gate length. The seam in the first gate electrode material disposed at approximately the center of the first gate length. The second gate electrode has a second gate length, equal to, or less than, the first gate length. The z-height of the first and second gate electrodes is less than z-height of the intervening dielectric material. The first and second gate electrode each comprise a fill metal, the fill metal of the first gate electrode being at least one of a different composition or microstructure than the fill metal of the second gate electrode.

In furtherance of the embodiment above, the first and second gate electrodes have z-heights that are substantially equal. A capping material is disposed over a top surface of the first gate electrode and over a surface of the second gate electrode, the capping material occluding the seam in the first gate electrode.

In furtherance of the embodiment above, the MOS transistor is coupled to the first gate electrode to control a voltage level between the first gate electrode and the first drain region.

In further of the first embodiment, the antifuse bit-cell further includes a MOS transistor coupled to the first gate electrode or to the first drain contact. The transistor further includes a second semiconductor channel region disposed over the substrate. The transistor further includes a second semiconductor source region and a second drain region, of a conductivity type complementary to the second channel region, disposed over the substrate and on opposite sides of the second channel region. The transistor further includes a second source contact interfacing with the second source region and a second drain contact interfacing with the second drain region. The transistor further includes a second gate dielectric disposed over the second channel region. The transistor further includes a second gate electrode separated from the second channel region by the second gate dielectric and separated from the second source and drain contacts by the intervening dielectric material, wherein the second gate electrode has a second z-height from an interface with the second gate dielectric that is greater the z-height of the first gate electrode, and wherein the second gate electrode has a second seam occluded by a top surface of the second electrode.

In one or more second embodiments, a method of fabricating a MOS antifuse bit-cell includes forming a first opening in a surrounding dielectric material, the first opening exposing a first semiconductor channel region. The method further includes forming a first gate dielectric over the first semiconductor channel region. The method further includes forming a first gate electrode by filling the first opening from sidewalls of the surrounding dielectric material. The method further includes recessing the first gate electrode relative to the surrounding dielectric material to open a seam in the first gate electrode and expose the seam to the gate electrode recess etch process. The method further includes forming first source and drain contacts to first source and drain regions disposed on opposite sides of the first channel region.

In furtherance of the second embodiment, forming the antifuse bit-cell further comprises planarizing a first gate electrode material with the surrounding dielectric material before recessing the first gate electrode below a z-height of the dielectric material, and opening the seam exposes the first gate dielectric.

In furtherance of the second embodiment, depositing the first gate electrode further comprises depositing a first fill metal with deposition process that is conformal for the aspect ratio of the first opening.

In furtherance of the second embodiment, forming the antifuse bit-cell further comprises forming a second opening in a surrounding dielectric material, the second opening exposing a second semiconductor channel region. Forming the antifuse bit-cell further comprises forming a second gate dielectric over the second semiconductor channel region. Forming the antifuse bit-cell further comprises forming a second gate electrode by backfilling the second opening with a non-conformal deposition. Forming the antifuse bit-cell further comprises recessing the second gate electrode. Forming second source and drain contacts to second source and drain regions disposed on opposite sides of the second channel region.

In furtherance of the embodiment immediately above, the second opening has a lower aspect ratio than that of the first opening and depositing the first gate electrode and second gate electrode further comprises depositing a first fill metal with a process that is conformal for the aspect ratio of the first opening and superfilling for the aspect ratio of the second opening.

In furtherance of the embodiment immediately above, depositing the first fill metal further comprises depositing the gate electrode with a chemical vapor deposition (CVD) or atomic layer deposition (ALD) process.

In furtherance of an embodiment above, the second opening has a second aspect ratio equal to, or greater than, that of the first opening. Depositing the first gate electrode further comprises depositing a first fill metal with deposition process that is conformal for the aspect ratio of the first opening. Depositing the second gate electrode further comprises depositing a second fill metal with a process that is superfilling for the aspect ratio of the second opening.

In furtherance of the second embodiment, forming the first gate dielectric further comprises forming an isolation dielectric surrounding sacrificial gate features. Forming the first opening further comprises removing the sacrificial gate features to form first and second openings that expose first and second semiconductor channel regions. Forming the first gate electrode further comprises depositing a gate dielectric over the first and second semiconductor channel regions and backfilling a gate electrode material into the first and second openings with a deposition process that forms a seam in the electrode material backfilled in at least the first opening, planarizing the gate electrode material with the isolation dielectric, and planarizing the second gate electrode material with the isolation dielectric. Recessing the first gate electrode further comprises recessing the gate electrode material below the isolation dielectric, the recessing opening the seam. The method further comprises capping the first and second gate electrode materials with a dielectric to occlude the seam. The method further comprises forming source/drain contacts to source/drain regions on opposite sides of the first and second channel regions.

In furtherance of the embodiment immediately above, the first and second openings have substantially the same aspect ratio, and recessing the gate electrode material further comprises recessing the gate electrode material backfilling the first opening to a first gate electrode z-height that is less than a z-height of the second gate electrode.

In furtherance of the embodiment immediately above, a seam present in the electrode material backfilling the second opening remains occluded by a top surface of the electrode material after the recessing of the gate electrode material.

In one or more third embodiments, a method of fabricating a MOS antifuse bit-cell includes forming an isolation dielectric surrounding sacrificial gate features. The method further includes removing the sacrificial gate features to form first and second openings that expose first and second semiconductor channel regions. The method further includes depositing a gate dielectric over the first and second semiconductor channel regions. The method further includes backfilling a gate electrode material into the first and second openings with a deposition process that forms a seam in the electrode material backfilled in at least the first opening. The method further includes planarizing the gate electrode material with the isolation dielectric. The method further includes planarizing the second gate electrode material with the isolation dielectric. The method further includes recessing the gate electrode material below the isolation dielectric, the recessing opening the seam. The method further includes capping the first and second gate electrode materials with a dielectric to occlude the seam. The method further includes forming source/drain contacts to source/drain regions on opposite sides of the first and second channel regions.

In furtherance of the third embodiment, the first and second openings have substantially the same aspect ratio, and recessing the gate electrode material further comprises recessing the gate electrode material backfilling the first opening to a first gate electrode z-height that is less than a z-height of the second gate electrode.

In furtherance of the embodiment immediately above, a seam present in the electrode material backfilled in the second opening remains occluded by a top surface of the electrode material after the recessing of the gate electrode material.

In one or more fourth embodiment, a system on a chip (SoC) includes processor logic circuitry, memory circuitry coupled to the processor logic circuitry, RF circuitry coupled to the processor logic circuitry and including radio transmission circuitry and radio receiver circuitry, and power management circuitry including an input to receive a DC power supply and an output coupled to at least one of the processor logic circuitry, memory circuitry, or RF circuitry. At least one of the RF circuitry or power management circuitry includes the MOS antifuse bit-cell as recited in any of the first embodiments.

In furtherance of the fourth embodiment, the MOS antifuse bit-cell further comprises a first semiconductor channel region disposed over a substrate. The MOS antifuse bit-cell further comprises a first semiconductor source region and a first drain region, of a conductivity type complementary to the first channel region, disposed over the substrate and on opposite sides of the first channel region. The MOS antifuse bit-cell further comprises a first drain contact interfacing with the first drain region and a first source contact interfacing with the first source region. The MOS antifuse bit-cell further comprises a first gate dielectric disposed over the first channel region. The MOS antifuse bit-cell further comprises a first gate electrode separated from the first channel region by the first gate dielectric and separated from the first drain and source contacts by an intervening dielectric, the first gate electrode having a seam extending from a top surface of the first gate electrode through a z-height approaching the first gate dielectric.

In furtherance of the fourth embodiment, the first gate electrode has a first gate length, the seam in the first gate electrode material disposed at approximately the center of the first gate length, and the z-height of the first gate electrode is less than z-height of the intervening dielectric.

In one or more fifth embodiments, a system on a chip (SoC) includes processor logic circuitry, memory circuitry coupled to the processor logic circuitry, RF circuitry coupled to the processor logic circuitry and including radio transmission circuitry and radio receiver circuitry, power management circuitry including an input to receive a DC power supply and an output coupled to at least one of the processor logic circuitry, memory circuitry, or RF circuitry. At least one of the RF circuitry or power management circuitry includes a MOS antifuse bit-cell. The MOS antifuse bit-cell further includes a first semiconductor channel region disposed over a substrate. The MOS antifuse bit-cell further includes a first semiconductor source region and a first drain region, of a conductivity type complementary to the first channel region, disposed over the substrate and on opposite sides of the first channel region. The MOS antifuse bit-cell further includes a first drain contact interfacing with the first drain region and a first source contact interfacing with the first source region. The MOS antifuse bit-cell further includes a first gate dielectric disposed over the first channel region. The MOS antifuse bit-cell further includes a first gate electrode separated from the first channel region by the first gate dielectric and separated from the first drain and source contacts by an intervening dielectric, the first gate electrode having a seam extending from a top surface of the first gate electrode through a z-height approaching the first gate dielectric.

In furtherance of the fifth embodiment, the first gate electrode has a first gate length. The seam in the first gate electrode material disposed at approximately the center of the first gate length. The z-height of the first gate electrode is less than z-height of the intervening dielectric.

However, the above embodiments are not limited in this regard and, in various implementations, the above embodiments may include undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A metal-oxide-semiconductor (MOS) antifuse structure comprising:
   a semiconductor channel region;
   a source region and a drain region on opposite sides of the channel region, wherein at least one of the source and drain regions is to be a first terminal of the antifuse structure;
   a source contact interfacing with the source region and a drain contact interfacing with the drain region;
   a gate dielectric over the channel region; and
   a gate electrode separated from the channel region by the gate dielectric and separated from the drain and source contacts by an intervening dielectric material, the gate electrode to be a second terminal of the antifuse structure, and the gate electrode having a seam extending from a top surface of the gate electrode and exposing the gate dielectric.

2. The structure of claim 1, wherein:
   the gate electrode has a gate length; and
   the seam is at approximately the center of the gate length.

3. The structure of claim 1, further comprising:
   a MOS transistor structure coupled to the first or second terminal of the MOS antifuse structure, the transistor structure further comprising:
   a second semiconductor channel region;
   a second source region and a second drain region on opposite sides of the second channel region;
   a second gate dielectric disposed over the second channel region; and
   a second gate electrode separated from the second channel region by the second gate dielectric, wherein the second gate electrode lacks a seam exposing the second gate dielectric.

4. The structure of claim 3, wherein:
   the gate electrode has a gate length;
   the seam is at approximately the center of the gate length;
   the gate electrode has a z-height less than that of the intervening dielectric material;
   the second gate electrode has a second gate length, larger than the gate length; and
   the first and second gate electrode have substantially the same material composition.

5. The structure of claim 3, wherein:
   the gate electrode has a gate length;
   the seam in the gate electrode material is at approximately the center of the gate length; and
   the second gate electrode has a second gate length, equal to, or greater than, the gate length.

6. The structure of claim 3 wherein:
   the gate electrodes have z-heights that are substantially equal; and
   a capping dielectric is over a top surface of the gate electrodes, the capping dielectric occluding the seam.

7. The structure of claim 3, wherein:
   the MOS transistor structure is coupled to the second terminal of the MOS antifuse structure to control a voltage level between the first and second terminals of the MOS antifuse structure.

8. The structure of claim 1, further comprising:
   a MOS transistor structure coupled to the first or second terminals of the MOS antifuse structure, the transistor structure further comprising:
   a second semiconductor channel region;
   a second source region and a second drain region on opposite sides of the second channel region;
   a second source contact interfacing with the second source region and a second drain contact interfacing with the second drain region;
   a second gate dielectric over the second channel region; and
   a second gate electrode separated from the second channel region by the second gate dielectric and separated from the second source and drain contacts by the intervening dielectric material, wherein the second gate electrode has a second z-height from an interface with the second gate dielectric that is greater than the z-height of the gate electrode, and wherein the second gate electrode has a second seam occluded by a top surface of the second electrode.

9. A system on a chip (SoC), comprising:
processor logic circuitry;
memory circuitry coupled to the processor logic circuitry;
RF circuitry coupled to the processor logic circuitry, the RF circuitry including radio transmission circuitry and radio receiver circuitry; and
power management circuitry including an input to receive a DC power supply and an output coupled to at least one of the processor logic circuitry, memory circuitry, or RF circuitry, wherein at least one of the RF circuitry or power management circuitry includes the MOS antifuse structure recited in claim 1.

10. The SoC of claim 9, wherein:
the gate electrode has a gate length;
the seam in the gate electrode is at approximately the center of the gate length; and
the gate electrode has a z-height less than that of the intervening dielectric.

11. The structure of claim 3, wherein the MOS antifuse structure has dielectric breakdown at a first voltage, applied across the first and second terminals, and wherein the first voltage is lower than a second voltage, applied across the second gate electrode and the second drain, at which breakdown of the second gate dielectric occurs.

12. A method of fabricating a MOS antifuse structure, the method comprising:
forming an opening in a dielectric material, the opening exposing a semiconductor channel region;
forming a gate dielectric over the semiconductor channel region;
forming source and drain regions on opposite sides of the semiconductor channel region;
forming a gate electrode by filling the opening from sidewalls of the dielectric material;
recessing the gate electrode relative to the dielectric material to open a seam in the gate electrode and expose the seam to an etch process employed for the recessing, wherein the seam exposes the gate dielectric.

13. The method of claim 12, further comprising:
planarizing the gate electrode with the dielectric material before recessing the gate electrode below a z-height of the dielectric material.

14. The method of claim 12, wherein depositing the gate electrode further comprises depositing a fill metal with a deposition process that is substantially conformal for an aspect ratio of the opening.

15. The method of claim 12, further comprising:
forming a second opening in a dielectric material, the second opening exposing a second semiconductor channel region;
forming a second gate dielectric over the second semiconductor channel region;
forming a second gate electrode by backfilling the second opening with a non-conformal deposition; and
recessing the second gate electrode without opening a seam in the second gate electrode.

16. The method of claim 15, wherein:
the second opening has a lower aspect ratio than that of the opening;
depositing the gate electrodes further comprises depositing a fill metal with a process that is conformal for an aspect ratio of the opening and superfilling for an aspect ratio of the second opening.

17. The method of claim 16, wherein:
depositing the fill metal further comprises a chemical vapor deposition (CVD) or atomic layer deposition (ALD) process.

18. The method of claim 15, wherein:
the second opening has a second aspect ratio equal to, or greater than, an aspect ratio of the opening;
depositing the gate electrode further comprises depositing a first fill metal with deposition process that is conformal for the aspect ratio of the opening;
depositing the second gate electrode further comprises depositing a second fill metal with a process that is superfilling for the second aspect ratio of the second opening.

19. The method of claim 15, wherein:
forming the gate dielectric further comprises forming an isolation dielectric surrounding sacrificial gate features;
forming the opening and the second opening further comprises removing the sacrificial gate features to form the opening that exposes the semiconductor channel region and to form the second opening that exposes the second semiconductor channel region;
the method further comprises:
depositing a gate dielectric over the semiconductor channel region and over the second semiconductor channel region;
backfilling a gate electrode material into the opening and the second opening with a deposition process that forms a seam in the electrode material backfilled in at least the opening; and
planarizing the gate electrode material with the isolation;
recessing the gate electrode further comprises recessing the gate electrode material below the isolation dielectric, the recessing opening the seam; and
the method further comprises:
capping the gate electrode material with a dielectric to occlude the seam; and
forming source and drain contacts to the source and drain regions.

20. The method of claim 19, wherein:
the opening and the second opening have substantially the same aspect ratio; and
recessing the gate electrode material further comprises recessing the gate electrode material backfilling the opening to a first gate electrode z-height that is less than a z-height of the second gate electrode.

21. The method of claim 20, wherein a seam present in the gate electrode material backfilling the second opening remains occluded by a top surface of the gate electrode material after the recessing of the gate electrode material.

* * * * *